US011856815B2

(12) United States Patent
Lee et al.

(10) Patent No.: US 11,856,815 B2
(45) Date of Patent: Dec. 26, 2023

(54) DISPLAY PANEL AND ELECTRONIC APPARATUS

(71) Applicant: SAMSUNG DISPLAY CO., LTD., Yongin-si (KR)

(72) Inventors: Jiwon Lee, Yongin-si (KR); Sangho Kim, Yongin-si (KR); Soomin Baek, Yongin-si (KR); Cheonmyeong Lee, Yongin-si (KR); Juhwa Ha, Yongin-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 86 days.

(21) Appl. No.: 17/505,942

(22) Filed: Oct. 20, 2021

(65) Prior Publication Data

US 2022/0223805 A1 Jul. 14, 2022

(30) Foreign Application Priority Data

Jan. 14, 2021 (KR) .................. 10-2021-0005394

(51) Int. Cl.
*H10K 59/12* (2023.01)
*G06F 1/16* (2006.01)

(52) U.S. Cl.
CPC .............. *H10K 59/12* (2023.02); *G06F 1/163* (2013.01)

(58) Field of Classification Search
CPC .......... G09G 3/03; G09G 3/035; G06F 1/163; G02B 27/017; H10K 59/12
See application file for complete search history.

(56) References Cited

U.S. PATENT DOCUMENTS

| 9,989,801 | B2 | 6/2018 | Shi et al. |
| 10,754,150 | B2 | 8/2020 | Chung et al. |
| 10,754,158 | B2 | 8/2020 | Seo |
| 11,067,802 | B1* | 7/2021 | Harrison ............ G02B 27/0172 |
| 2013/0021226 | A1* | 1/2013 | Bell ..................... G02B 3/0006 |
| | | | 345/8 |
| 2017/0115489 | A1* | 4/2017 | Hu ........................ G06T 19/006 |
| 2019/0212561 | A1* | 7/2019 | Shin ..................... G06T 19/006 |

FOREIGN PATENT DOCUMENTS

| KR | 1020160086500 A | 7/2016 |
| KR | 1020180029772 A | 3/2018 |
| KR | 1020190084183 A | 7/2019 |

\* cited by examiner

*Primary Examiner* — James Wu
(74) *Attorney, Agent, or Firm* — CANTOR COLBURN LLP

(57) ABSTRACT

A display panel including a first edge extending in a first direction, a second edge extending in a second direction intersecting with the first direction, and a corner edge extending in a curved shape from the first edge to the second edge includes: a substrate including a front area overlapping a center of the display panel and a corner area extending from the front area to the corner edge; and a pixel arranged over the substrate, wherein the display panel is curved in the corner area in a direction in which the corner edge approaches the center of the display panel.

20 Claims, 21 Drawing Sheets

FIG. 9A

| 1 | 2 | 3 | 4 | 5 | 6 | 7 | 8 |
|---|---|---|---|---|---|---|---|
| 9 | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |

DISPLAY PANEL AND ELECTRONIC APPARATUS

This application claims priority to Korean Patent Application No. 10-2021-0005394, filed on Jan. 14, 2021, and all the benefits accruing therefrom under 35 U.S.C. § 119, the content of which in its entirety is herein incorporated by reference.

BACKGROUND

1. Field

One or more embodiments relate to display panels and electronic apparatuses.

2. Description of the Related Art

An electronic apparatus with mobility has been widely used. In addition to a portable electronic apparatus such as a mobile phone, an electronic apparatus including a head-mounted display ("HMD") worn on a head so that a user may experience augmented reality ("AR") or virtual reality ("VR") have been developed as a mobile electronic apparatus.

Such an electronic apparatus include a display panel to provide a user with various functions, for example, visual information such as images or videos. As other components for driving a display panel have been miniaturized, the proportion of the display panel in an electronic apparatus has gradually increased.

Also, flexible display panels that may be bent (or curved), folded, or rolled in a roll shape have been recently researched and developed. Furthermore, research and development has been actively conducted on a stretchable display panel that may change into various forms and a display panel that may curve at a corner and display an image.

SUMMARY

One or more embodiments include a display panel and an electronic apparatus capable of reducing a screen distortion.

Additional aspects will be set forth in part in the description which follows and, in part, will be apparent from the description, or may be learned by practice of the presented embodiments.

According to one or more embodiments, a display panel including a first edge extending in a first direction, a second edge extending in a second direction intersecting with the first direction, and a corner edge extending from the first edge to the second edge includes a substrate including a front area overlapping a center of the display panel and a corner area extending in a curved shape from the front area to the corner edge, and a pixel arranged over the substrate, where the display panel is curved in the corner area in a direction in which the corner edge approaches the center of the display panel.

In an embodiment, the display panel may include an upper surface where an image is displayed and a lower surface opposite to the upper surface, the corner area may include a plurality of corner areas, and the lower surface may at least partially surround the upper surface in the plurality of corner areas.

In an embodiment, the display panel may be flat in the front area.

In an embodiment, the display panel may be curved in a dome shape in the front area.

In an embodiment, the front area may include a first front area and a second front area arranged between the first front area and the corner area, and an upper surface of the display panel may be flat in the first front area and may be curved in the second front area with a different curvature from a curvature of the corner area.

In an embodiment, the corner area may include a first area and a second area spaced apart from each other, the pixel may include a first pixel arranged over the substrate to overlap the first area and a second pixel arranged over the substrate to overlap the second area, and the display panel may provide a through-portion at least partially defined by an edge of the first area and an edge of the second area.

In an embodiment, the first area and the second area may extend from the front area to the corner edge, and the edge of the first area and the edge of the second area may face each other.

In an embodiment, the corner area may further include a first extension area extending in a first extension direction and a second extension area extending in a second extension direction intersecting with the first extension direction, one of the first extension area and the second extension area may extend from the first area to the second area, and an edge of the one of the first extension area and the second extension area, the edge of the first area, and the edge of the second area may define at least a portion of the through-portion.

In an embodiment, the corner area may further include an extension area extending from the first area to the second area, an extension direction of the extension area may change at least two times along a way from the first area to the second area, and an edge of the extension area, the edge of the first area, and the edge of the second area may define at least a portion of the through-portion.

In an embodiment, the display panel may further include a first display element arranged over the substrate to overlap the first area and implement the first pixel, a second display element arranged over the substrate to overlap the second area and implement the second pixel, and an encapsulation layer covering the first display element and the second display element and including at least one inorganic encapsulation layer and at least one organic encapsulation layer, wherein the encapsulation layer may be separated with the through-portion therebetween.

According to one or more embodiments, an electronic apparatus includes a display panel including a first edge extending in a first direction, a second edge extending in a second direction intersecting with the first direction, and a corner edge extending from the first edge to the second edge, and an optical unit including a plurality of lenses facing the display panel, where a lens edge of each of the plurality of lenses extends while being spaced apart from the corner edge by a uniform interval in a plan view.

In an embodiment, each of the lens edge and the corner edge may have a curvature, and a curvature center of the lens edge and a curvature center of the corner edge may coincide with each other in the plan view.

In an embodiment, the lens edge may have a curved shape at least partially surrounding a central axis of the optical unit, and the corner edge may have a curved shape at least partially surrounding a center of the display panel.

In an embodiment, the display panel may include a substrate including a front area overlapping a center of the display panel and a corner area extending from the front area to the corner edge, and a pixel arranged over the substrate, wherein the display panel may be curved in the corner area in a direction in which the corner edge approaches the center of the display panel.

In an embodiment, the display panel may be curved in a direction toward the plurality of lenses.

In an embodiment, the corner area may include a plurality of corner areas, and the plurality of lenses may face the plurality of corner areas, respectively.

In an embodiment, each of the plurality of lenses may include a lower surface facing the display panel and an upper surface opposite to the lower surface, the upper surface may include a first upper surface and a second upper surface connected to the first upper surface and extending in a direction intersecting with the first upper surface, and the second upper surface may be connected to the lower surface and may extend in a direction intersecting with the lower surface.

In an embodiment, the first upper surface may include a flat surface, and the second upper surface may include a curved surface.

In an embodiment, the display panel may include a first display panel and a second display panel, the optical unit may include a first optical unit and a second optical unit, the first optical unit may face the first display panel, and the second optical unit may face the second display panel.

In an embodiment, the electronic apparatus may further include a case unit accommodating the display panel and the optical unit, and a fixing unit which fixes the case unit to a user's head.

BRIEF DESCRIPTION OF THE DRAWINGS

The above and other aspects, features, and advantages of certain embodiments will be more apparent from the following description taken in conjunction with the accompanying drawings, in which:

FIG. 9A illustrates an example of an image displayed on a display panel;

DETAILED DESCRIPTION

Figure 1:
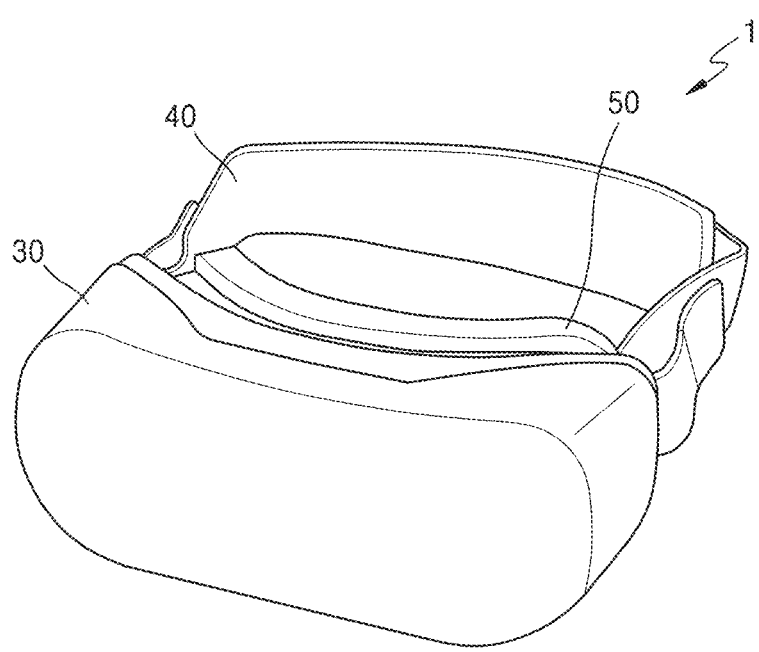
FIG. 1 is a perspective view schematically illustrating an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component or may be "indirectly electrically connected to" the other layer, region, or component with one or more intervening layers, regions, or components therebetween.

An electronic apparatus may include a display panel. The display panel may display a moving image or a still image and may be used as a display screen of various products such as televisions, notebook computers, monitors, billboards, and Internet of Things ("IoT") as well as portable electronic apparatuses such as mobile phones, smart phones, tablet personal computers ("PCs"), mobile communication terminals, electronic notebooks, electronic books, portable multimedia players ("PMPs"), navigation, and Ultra Mobile PCs ("UMPCs"). Also, the display panel according to an embodiment may be used in wearable devices such as smart watches, watch phones, glasses-type displays, and head-mounted displays (HMDs). Also, the display panel according to an embodiment may be used as a center information display ("CID") located at a vehicle's instrument panel or a vehicle's center fascia or dashboard, a room mirror display replacing a vehicle's side mirror, or a display located at a rear side of a vehicle's front seat as an entertainment for a vehicle's rear seat.

Figure 2:
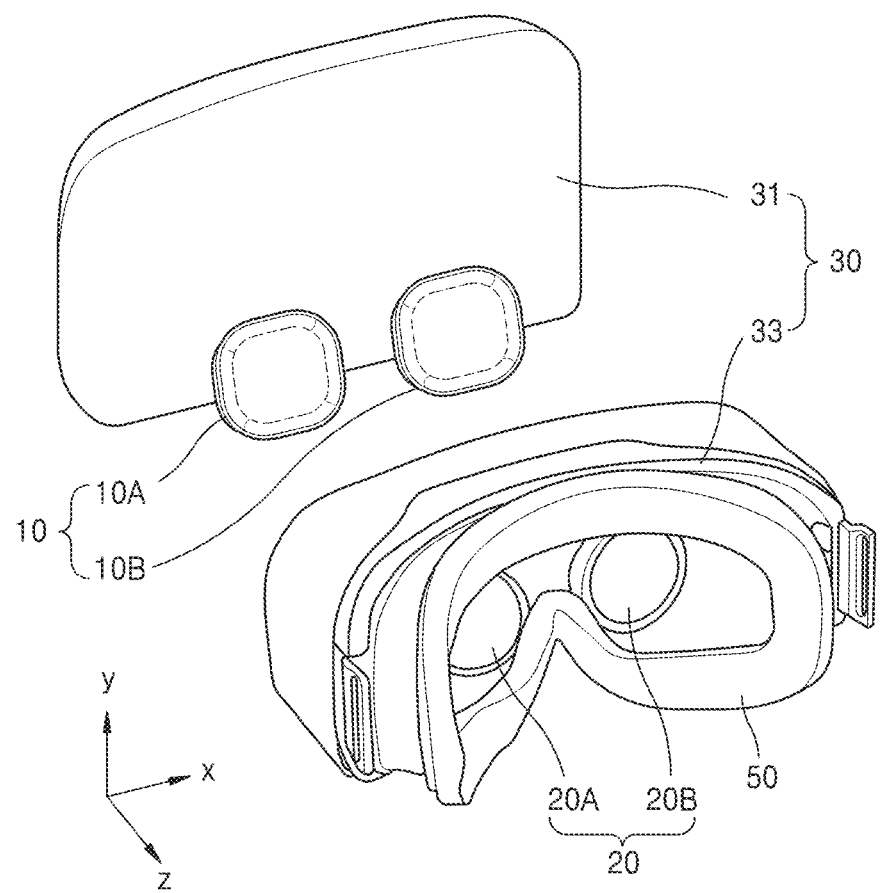
FIG. 2 is an exploded view schematically illustrating an electronic apparatus according to an embodiment.

FIG. 1 is a perspective view schematically illustrating an electronic apparatus 1 according to an embodiment. FIG. 2 is an exploded view schematically illustrating an electronic apparatus 1 according to an embodiment.

Referring to FIGS. 1 and 2, the electronic apparatus 1 may be worn on the head of a user (not illustrated). The electronic apparatus 1 may provide an image in a state where the user's actual peripheral view is blocked or not blocked. The user wearing the electronic apparatus 1 may be easily immersed in augmented reality or virtual reality. The electronic apparatus 1 may include a display panel 10, an optical unit 20, a case unit 30, a fixing unit 40, and a cushion unit 50.

The display panel 10 may provide an image. The display panel 10 may provide an image by emitting light. The display panel 10 may be accommodated in the case unit 30. In an embodiment, the electronic apparatus 1 may include a plurality of display panels 10. For example, the electronic apparatus 1 may include a first display panel 10A and a second display panel 10B. In this case, the first display panel 10A and the second display panel 10B may overlap a plurality of optical units 20 in the z direction. The z direction may be parallel to the central axis 10AX of the display panel 10 and the central axis 20AX of the optical units 20 (See FIG. 8A). The first display panel 10A may be a left-eye display panel. The second display panel 10B may be a right-eye display panel. In other embodiments, the electronic apparatus 1 may include one display panel 10. In this case, each of the plurality of optical units 20 may overlap the one display panel 10.

The display panel 10 may be curved (or bent). In an embodiment, the display panel 10 may include a first edge extending in a first direction, a second edge extending in a direction intersecting with the first direction, and a corner edge extending from the first edge to the second edge. In an embodiment, a first portion of the display panel 10 including the first edge may be curved. In an embodiment, a second portion of the display panel 10 including the second edge may be curved. In an embodiment, a corner portion of the display panel 10 including the corner edge may be curved.

The optical unit 20 may transmit the light emitted from the display panel 10. The optical unit 20 may refract and/or reflect the light emitted from the display panel 10. In an embodiment, the optical unit 20 may enlarge the image provided from the display panel 10. The optical unit 20 may be arranged to face the display panel 10. When the user wears the electronic apparatus 1, the optical unit 20 may be arranged between the user and the display panel 10. Thus, the user may perceive the light that is emitted from the display panel 10 and refracted and/or reflected by the optical unit 20. In an embodiment, the optical unit 20 may include at least one of a lens and a mirror.

In an embodiment, the electronic apparatus 1 may include a plurality of optical units 20. For example, the electronic apparatus 1 may include a first optical unit 20A and a second optical unit 20B. In this case, the first display panel 10A may face the first optical unit 20A. The second display panel 10B may face the second optical unit 20B. The first optical unit 20A may be a left-eye optical unit for a left-eye. The second optical unit 20B may be a right-eye optical unit for a right-eye. In other embodiments, the electronic apparatus 1 may include one optical unit 20.

The case unit 30 may accommodate the display panel 10 and the optical unit 20. The case unit 30 may have a space therein, and the display panel 10 and the optical unit 20 may be arranged in the space. The case unit 30 may protect the display panel 10 and the optical unit 20 from external impact. In an embodiment, the case unit 30 may be divided into a cover unit 31 and a body unit 33. In other embodiments, the cover unit 31 and the body unit 33 may be integrally provided. In an embodiment, the cover unit 31 may be opaque. In another embodiment, the cover unit 31 may be transparent.

The case unit 30 may support the curved display panel 10. For example, the display panel 10 may be fixed inside the case unit 30. Also, the case unit 30 may support and maintain the shape of the curved display panel 10.

The fixing unit 40 may fix the case unit 30 to the user's head. Thus, the electronic apparatus 1 may be worn on the user's head. In an embodiment, the length of the fixing unit 40 may be adjusted. For example, the length of the fixing unit 40 may be adjusted according to the user's head circumference.

The fixing unit 40 may adhere the electronic apparatus 1 to the user's head. In an embodiment, the fixing unit 40 may have elasticity. FIG. 1 illustrates that the fixing unit 40 is a strap; however, in other embodiments, the fixing unit 40 may be of various types such as a helmet coupled to the case unit 30 or temples connected to the case unit 30. The fixing unit 40 may be connected to the case unit 30. In an embodiment, the fixing unit 40 may be detachably attached to the case unit 30.

The cushion unit 50 may improve the user's wearing fitness. When the user wears the electronic apparatus 1, the cushion unit 50 may be arranged between the user and the case unit 30. In an embodiment, the cushion unit 50 may be attached to the case unit 30. In an embodiment, the cushion unit 50 may be detached from the case unit 30. In an embodiment, the cushion unit 50 may be omitted.

The cushion unit 50 may include a material that may be freely modified in shape. For example, the cushion unit 50 may include a polymer resin. For example, the cushion unit 50 may include at least one of polyurethane, polycarbonate, polypropylene, and polyethylene. In other embodiments, the cushion unit 50 may include a sponge obtained by foaming a rubber liquid, a urethane-based material, or an acryl-based material.

Hereinafter, the display panel 10 and the optical unit 20 will be described in detail.

Figure 3:
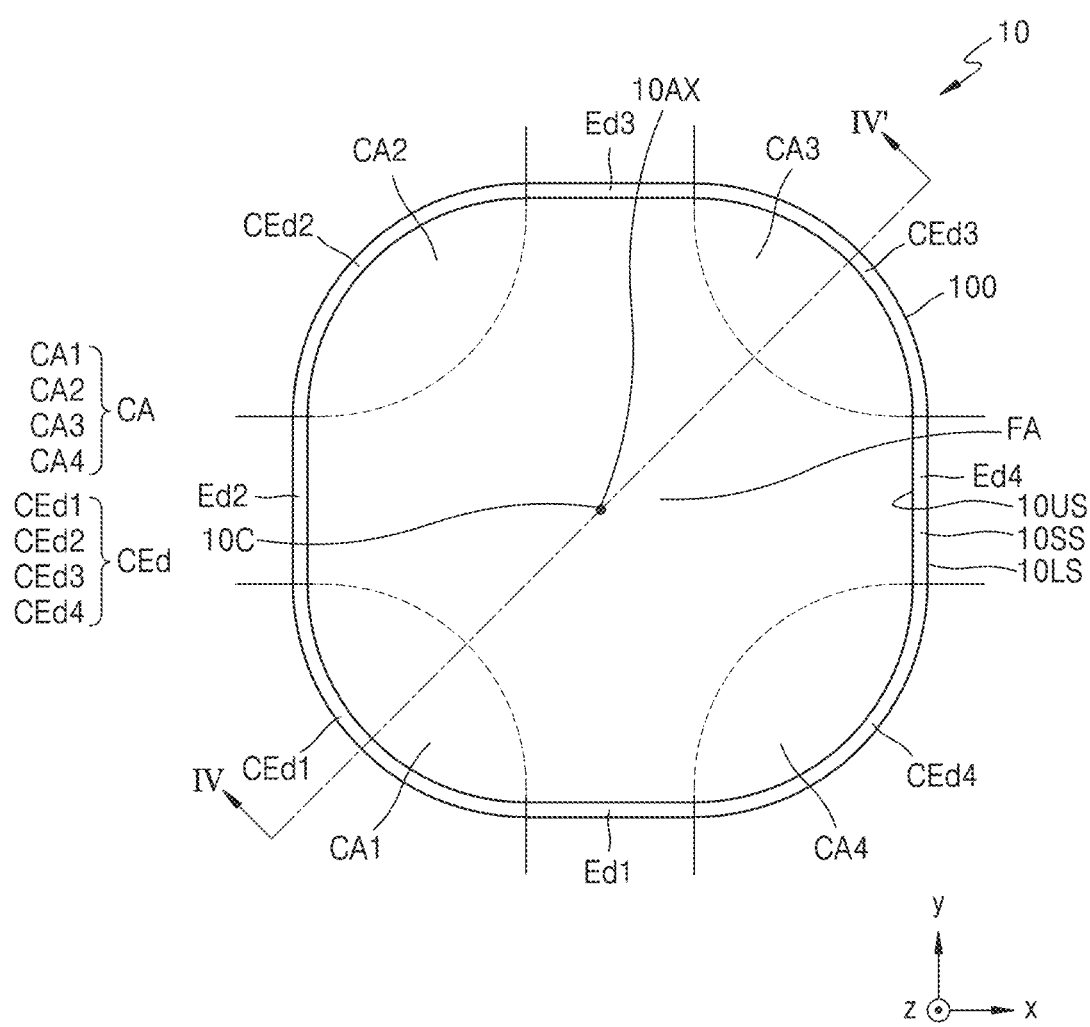
FIG. 3 is a plan view schematically illustrating a display panel according to an embodiment.

FIG. 3 is a plan view schematically illustrating a display panel 10 according to an embodiment. FIGS. 4A to 4D are cross-sectional views schematically illustrating display panels 10 according to various embodiments. FIG. 3 is a plan view illustrating a curved display panel 10. FIGS. 4A to 4D are cross-sectional views of the display panel taken along line IV-IV' of FIG. 3, respectively.

Referring to FIG. 3, the display panel 10 may include an edge. The edge may be an end portion of the display panel 10. The edge may be defined as a side surface 10SS of the display panel 10. In an embodiment, the display panel 10 may include an upper surface 10US, a lower surface 10SS, and a side surface 10SS. The upper surface 10US of the display panel 10 may be opposite to the lower surface 10LS of the display panel 10. The side surface 10SS of the display panel 10 may be connected to the upper surface 10US of the display panel 10 and the lower surface 10LS of the display panel 10. The side surface 10SS of the display panel 10 may intersect with the upper surface 10US of the display panel 10 and the lower surface 10LS of the display panel 10.

In an embodiment, the display panel 10 may include a first edge Ed1, a second edge Ed2, a third edge Ed3, a fourth edge Ed4, and a corner edge CEd. In some embodiments, some of the first edge Ed1, the second edge Ed2, the third edge Ed3, and the fourth edge Ed4 may be omitted. In some embodiments, the display panel 10 may further include a fifth edge or may further include more edges. Hereinafter, a detailed description will be mainly given of a case where the display panel 10 includes a first edge Ed1, a second edge Ed2, a third edge Ed3, a fourth edge Ed4, and a corner edge CEd.

The first edge Ed1 and/or the third edge Ed3 may extend in a first direction. The second edge Ed2 and/or the fourth edge Ed4 may extend in a second direction intersecting with the first direction. In an embodiment, the first direction and the second direction may be perpendicular to each other. For example, the first direction may be an x direction or a −x direction, and the second direction may be a y direction or a −y direction. In other embodiments, the first direction and the second direction may form an acute angle or an obtuse angle therebetween. Hereinafter, a detailed description will be mainly given of a case where the first direction (e.g., x direction or −x direction) and the second direction (e.g., y direction or −y direction) are perpendicular to each other.

The corner edge CEd may extend between the adjacent edges among the first to fourth edges. In an embodiment, the corner edge CEd may include a first corner edge CEd1, a second corner edge CEd2, a third corner edge CEd3, and a fourth corner edge CEd4. In some embodiments, some of the first corner edge CEd1, the second corner edge CEd2, the third corner edge CEd3, and the fourth corner edge CEd4 may be omitted. In some embodiments, a fifth corner edge or more corner edges may be further included. Hereinafter, a detailed description will be mainly given of a case where the corner edge CEd includes a first corner edge CEd1, a second corner edge CEd2, a third corner edge CEd3, and a fourth corner edge CEd4.

The first corner edge CEd1 may extend between the first edge Ed1 and the second edge Ed2. That is, the first corner edge CEd1 may extend from the first edge Ed1 to the second edge Ed2. The second corner edge CEd2 may extend between the second edge Ed2 and the third edge Ed3. That is, the second corner edge CEd2 may extend from the second edge Ed2 to the third edge Ed3. The third corner edge CEd3 may extend between the third edge Ed3 and the fourth edge Ed4. That is, the third corner edge CEd3 may extend from the third edge Ed3 to the fourth edge Ed4. The fourth corner edge CEd4 may extend between the fourth edge Ed4 and the first edge Ed1. That is, the fourth corner edge CEd4 may extend from the fourth edge Ed4 to the first edge Ed1.

The corner edge CEd may have a curved shape. In an embodiment, the corner edge CEd may have a curved shape at least partially surrounding a center 10C of the display panel 10. In an embodiment, the shape of the corner edge CEd may be a convex shape in a direction from the center 10C of the display panel 10 to the corner edge CEd. In an embodiment, the shape of the corner edge CEd may be a portion of a circular shape. In another embodiment, the shape of the corner edge CEd may be a portion of an elliptical shape.

In an embodiment, the corner edge CEd may have a curved shape at least partially surrounding a central axis 10AX of the display panel 10. The central axis 10AX of the display panel 10 may overlap the center 10C of the display panel 10. The central axis 10AX of the display panel 10 may extend in a third direction intersecting with the first direction (e.g., x direction or −x direction) and the second direction (e.g., y direction or −y direction). For example, the third direction may be a z direction or a −z direction.

The display panel 10 may include a substrate 100. The substrate 100 may include a front area FA and a corner area CA. The front area FA and the corner area CA may be surrounded by the edge of the display panel 10. The front area FA may overlap the center 10C of the display panel 10 and/or the central axis 10AX of the display panel 10. The corner area CA may extend from the front area FA to the corner edge CEd. The corner area CA may be connected to the corner edge CEd.

The corner areas CA may be provided as a plurality of corner areas. In an embodiment, the corner area CA may include a first corner area CA1, a second corner area CA2, a third corner area CA3, and a fourth corner area CA4. The first corner area CA1 may extend from the front area FA to the first corner edge CEd1. The first corner area CA1 may be connected to the first corner edge CEd1. The second corner area CA2 may extend from the front area FA to the second corner edge CEd2. The second corner area CA2 may be connected to the second corner edge CEd2. The third corner area CA3 may extend from the front area FA to the third corner edge CEd3. The third corner area CA3 may be connected to the third corner edge CEd3. The fourth corner area CA4 may extend from the front area FA to the fourth corner edge CEd4. The fourth corner area CA4 may be connected to the fourth corner edge CEd4.

The display panel 10 may be curved in the corner area CA. In an embodiment, the display panel 10 may be curved in at least one of the first corner area CA1, the second corner area CA2, the third corner area CA3, and the fourth corner area CA4. For example, the display panel 10 may be curved in the first corner area CA1, the second corner area CA2, the third corner area CA3, and the fourth corner area CA4.

The display panel 10 may be curved in the corner area CA in a direction in which the corner edge CEd approaches the center 10C of the display panel 10. In other words, the display panel 10 may be curved in the corner area CA in a direction in which the corner edge CEd approaches the central axis 10AX of the display panel 10. Thus, the display panel 10 may be at least partially curved toward the center 10C of the display panel 10 and/or the central axis 10AX of the display panel 10. This means that any line on the display panel 10 and which connects the center 10C and any point on the corner area CA in a shortest way is curved so that the direction of the curve of the line approaches the central axis 10AX. For example, a hemisphere structure meets this condition, but a cylindrical structure does not meet this condition.

In some embodiments, the display panel 10 may be curved in a direction in which the edge of the display panel 10 approaches the center 10C of the display panel 10. For example, the display panel 10 may be curved in a direction in which at least one of the first to fourth edges Ed1 to Ed4 approaches the center 10C of the display panel 10.

Pixels (not illustrated) may be arranged over the substrate 100. The pixels may be arranged over the substrate 100 to overlap at least one of the corner area CA and the front area FA. The pixels may emit light. Thus, the display panel 10 may display an image.

Referring to FIGS. 4A to 4D, the display panel 10 may display an image on the upper surface 10US of the display panel 10. In other embodiments, the display panel 10 may display an image on the lower surface 10LS of the display panel 10. In other embodiments, the display panel 10 may display an image on both the upper surface 10US of the display panel 10 and the lower surface 10LS of the display panel 10.

In an embodiment, the lower surface 10LS of the display panel 10 may be curved to at least partially surround the upper surface 10US of the display panel 10. In an embodiment, a curvature radius 10LSR of the lower surface 10LS of the display panel 10 may be greater than a curvature radius 10USR of the upper surface 10US of the display panel 10. Although not illustrated, in other embodiments, the upper surface 10US of the display panel 10 may be curved to at least partially surround the lower surface 10LS of the display panel 10. In an embodiment, the curvature radius 10USR of the upper surface 10US of the display panel 10 may be greater than the curvature radius 10LSR of the lower surface 10LS of the display panel 10. Hereinafter, a detailed description will be mainly given of a case where the lower surface 10LS of the display panel 10 is curved to at least partially surround the upper surface 10US of the display panel 10.

In an embodiment, a portion of the upper surface 10US of the display panel 10 overlapping the first corner area CA1 may at least partially face a portion of the upper surface 10US of the display panel 10 overlapping the third corner area CA3. Although not illustrated, in an embodiment, a portion of the upper surface 10US of the display panel 10 overlapping the second corner area CA2 may at least partially face a portion of the upper surface 10US of the display panel 10 overlapping the fourth corner area CA4.

In an embodiment, the display panel 10 may be symmetrically curved in the first corner area CA1 and the third corner area CA3 with respect to the central axis 10AX of the display panel 10. Although not illustrated, in an embodiment, the display panel 10 may be symmetrically curved in the second corner area CA2 and the fourth corner area CA4 with respect to the central axis 10AX of the display panel 10.

Figure 4A:
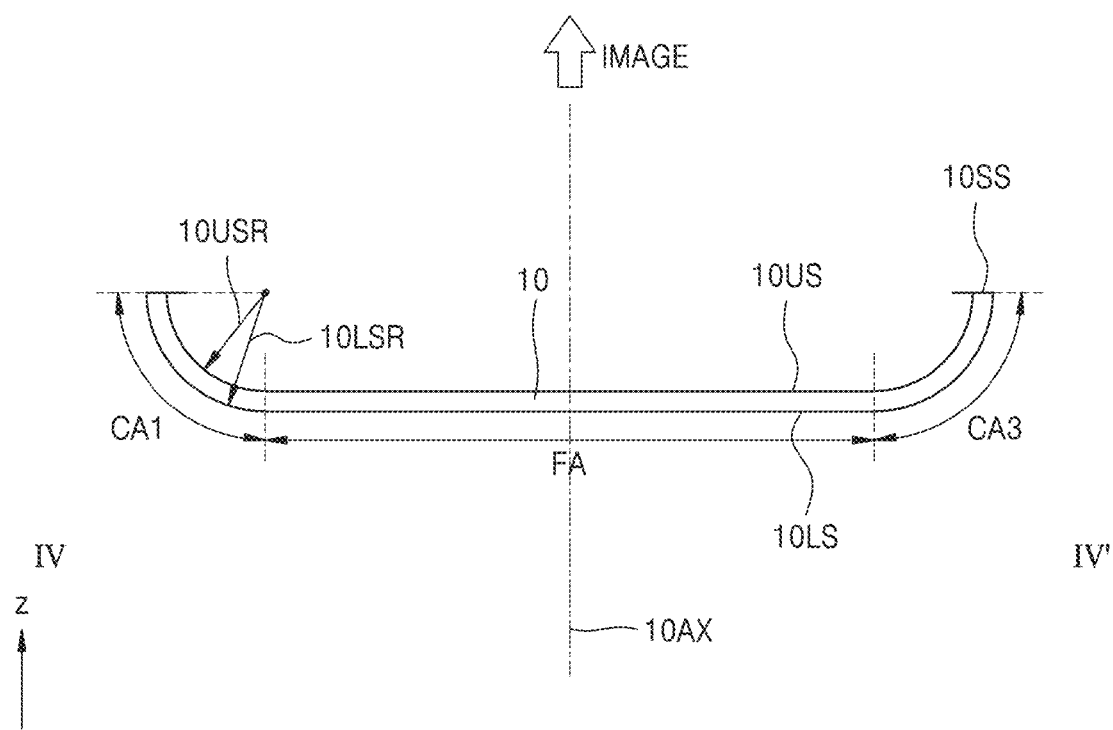
FIGS. 4A to 4D are cross-sectional views schematically illustrating display panels according to various embodiments.

Referring to FIG. 4A, the display panel 10 may be flat in the front area FA. In this case, each of the upper surface 10US of the display panel 10 and the lower surface 10LS of the display panel 10 may extend in one direction in the front area FA.

Figure 4B:
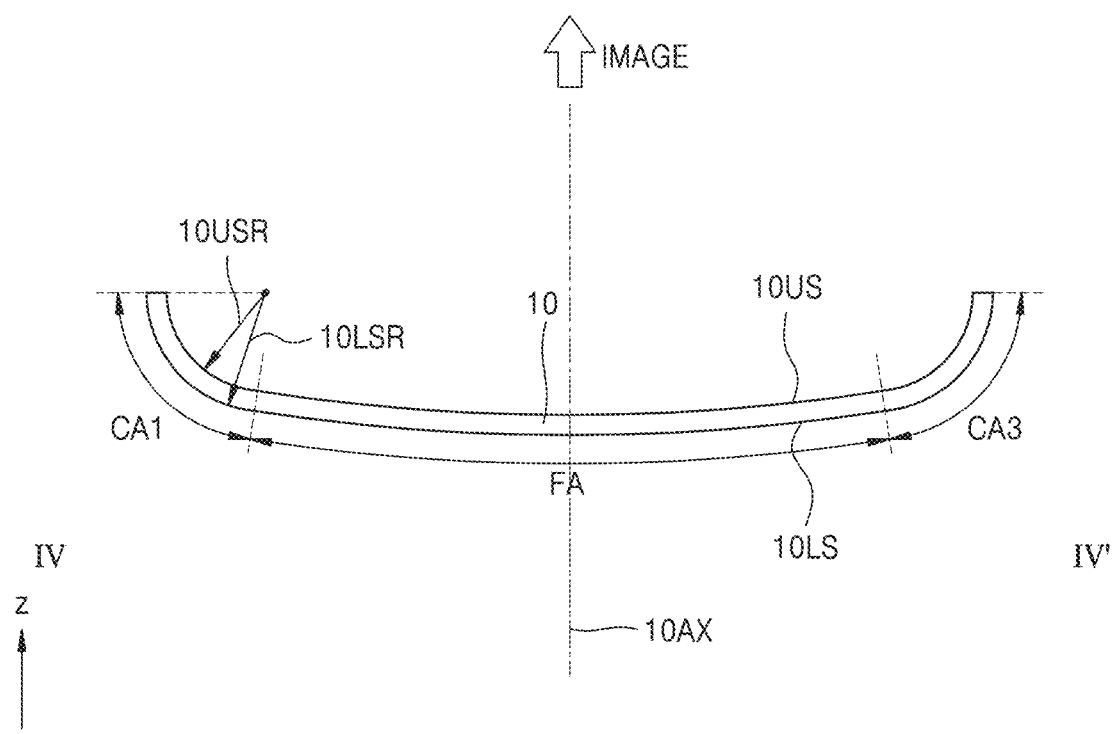

Referring to FIG. 4B, the display panel 10 may be curved in a dome shape in the front area FA. The display panel 10 may be convex downward in the front area FA. In this case, in the front area FA, the lower surface 10LS of the display panel 10 may at least partially surround the upper surface 10US of the display panel 10. The upper surface 10US of the display panel 10 and/or the lower surface 10LS of the display panel 10 may be arranged lowest in the central axis 10AX of the display panel 10. In an embodiment, the curvature of the upper surface 10US of the display panel 10 in the front area FA may be less than the curvature of the upper surface 10US of the display panel 10 in the first corner area CA1 and/or the third corner area CA3. In an embodiment, the curvature radius of the upper surface 10US of the display panel 10 in the front area FA may be greater than or equal to the curvature radius 10USR of the upper surface 10US of the display panel 10 in the first corner area CA1 and/or the third corner area CA3.

Figure 4C:
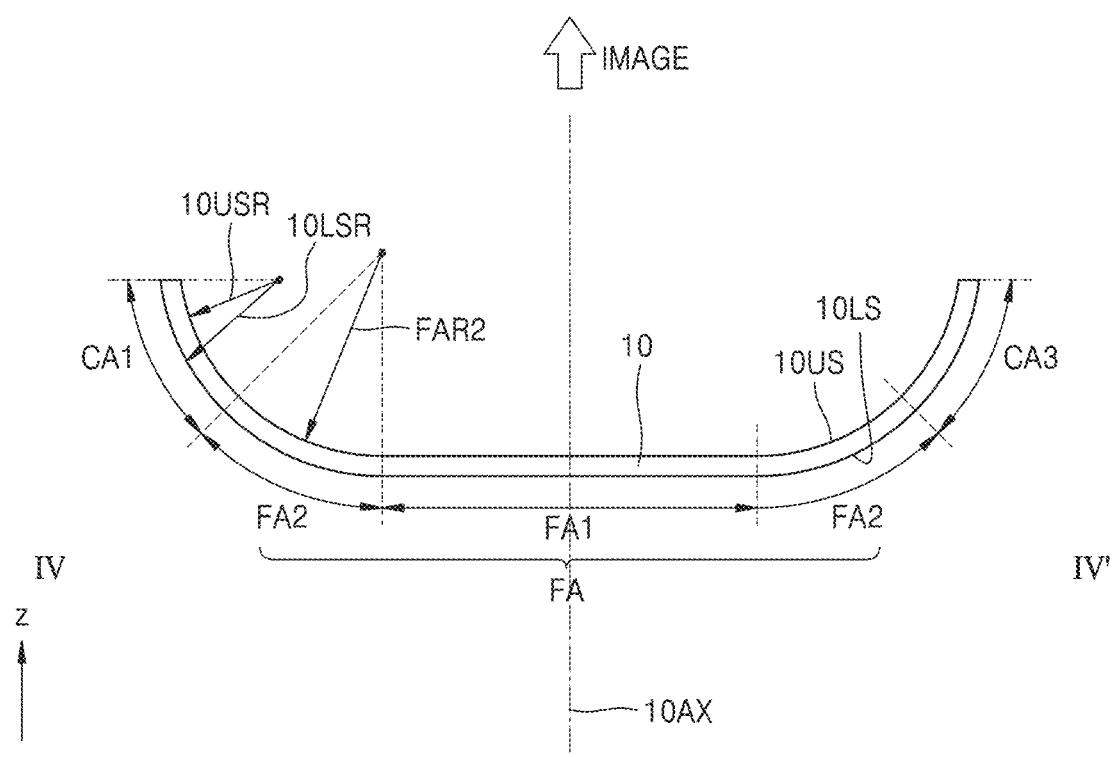

Referring to FIG. 4C, the front area FA may include a first front area FA1 and a second front area FA2. In an embodiment, the first front area FA1 may overlap the central axis 10AX of the display panel 10. The display panel 10 may be flat in the first front area FA1. For example, the upper surface 10US of the display panel 10 may be flat in the first front area FA1. The upper surface 10US of the display panel 10 may extend in one direction in the first front area FA1.

The second front area FA2 may be arranged between the first front area FA1 and the corner area. For example, the second front area FA2 may be arranged between the first front area FA1 and the first corner area CA1. The second front area FA2 may be arranged between the first front area FA1 and the third corner area CA3. The second front area FA2 may be symmetrically arranged with respect to the central axis 10AX of the display panel 10.

The second front area FA2 of the display panel 10 may be curved. The display panel 10 may be convex downward in the second front area FA2. In this case, in the second front area FA2, the lower surface 10LS of the display panel 10 may at least partially surround the upper surface 10US of the display panel 10.

The curvature of the upper surface 10US of the display panel 10 in the second front area FA2 may be different from the curvature of the upper surface 10US of the display panel 10 in the first corner area CA1 and/or the third corner area CA3. In an embodiment, the curvature of the upper surface 10US of the display panel 10 in the second front area FA2 may be less than the curvature of the upper surface 10US of the display panel 10 in the first corner area CA1 and/or the third corner area CA3.

A curvature radius FAR2 of the upper surface 10US of the display panel 10 in the second front area FA2 may be different from the curvature radius 10USR of the upper surface 10US of the display panel 10 in the first corner area CA1 and/or the third corner area CA3. For example, the curvature radius FAR2 of the upper surface 10US of the display panel 10 may be greater than the curvature radius 10USR of the upper surface 10US of the display panel 10 in the first corner area CA1 and/or the third corner area CA3. Thus, the display panel 10 may be curved with a different curvature radius in the second front area FA2 than in the corner area.

Figure 4D:
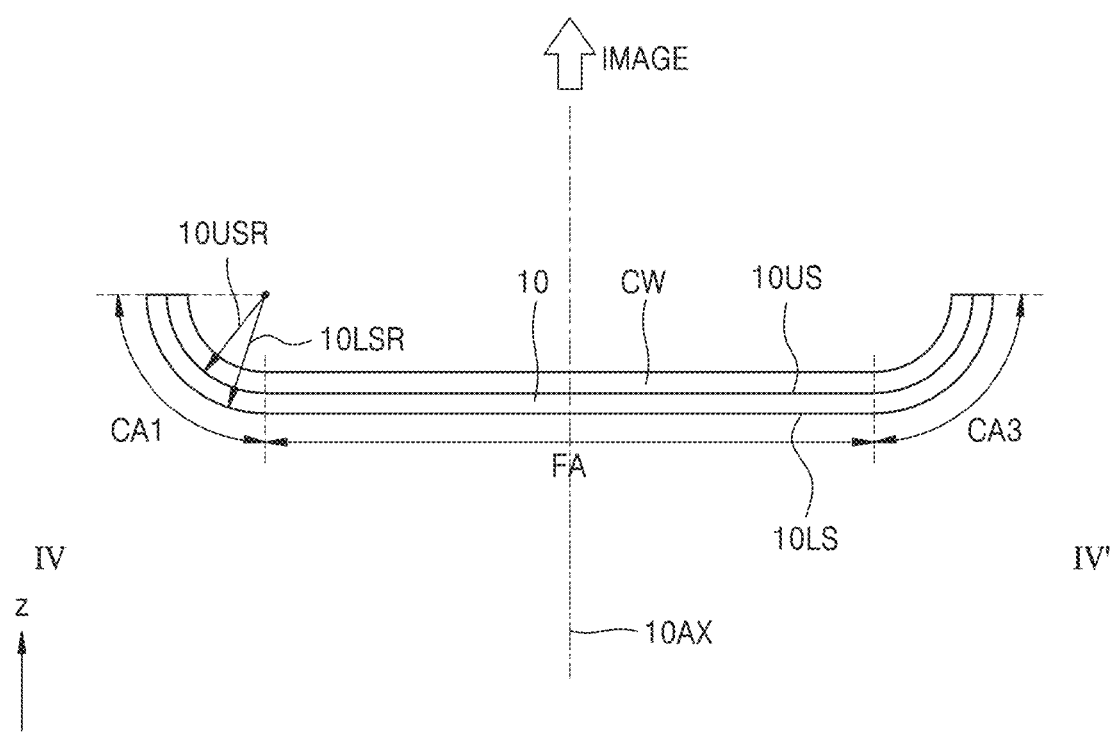

Referring to FIG. 4D, a cover window CW may be arranged over the display panel 10. In an embodiment, the cover window CW may be arranged on the upper surface 10US of the display panel 10. The cover window CW may protect the display panel 10. Also, the cover window CW may support the display panel 10 to maintain the shape thereof.

The cover window CW may be a flexible window. The cover window CW may protect the display panel 10 while being easily curved according to an external force without generating a crack or the like. The cover window CW may include glass, sapphire, or plastic. The cover window CW may include, for example, ultra-thin glass ("UTG") or colorless polyimide ("CPI"). In an embodiment, the cover window CW may have a structure in which a flexible polymer layer is arranged on one surface of a glass substrate or may include only a polymer layer.

Although not illustrated, in some embodiments, the display panel 10 and the cover window CW may be attached to each other by a transparent adhesive member such as an optically clear adhesive ("OCA") film.

In some embodiments, a support member for supporting the display panel 10 may be further arranged on the lower surface 10LS of the display panel 10. In some embodiments, when the support member is arranged, the cover window CW may be omitted.

Figure 5:
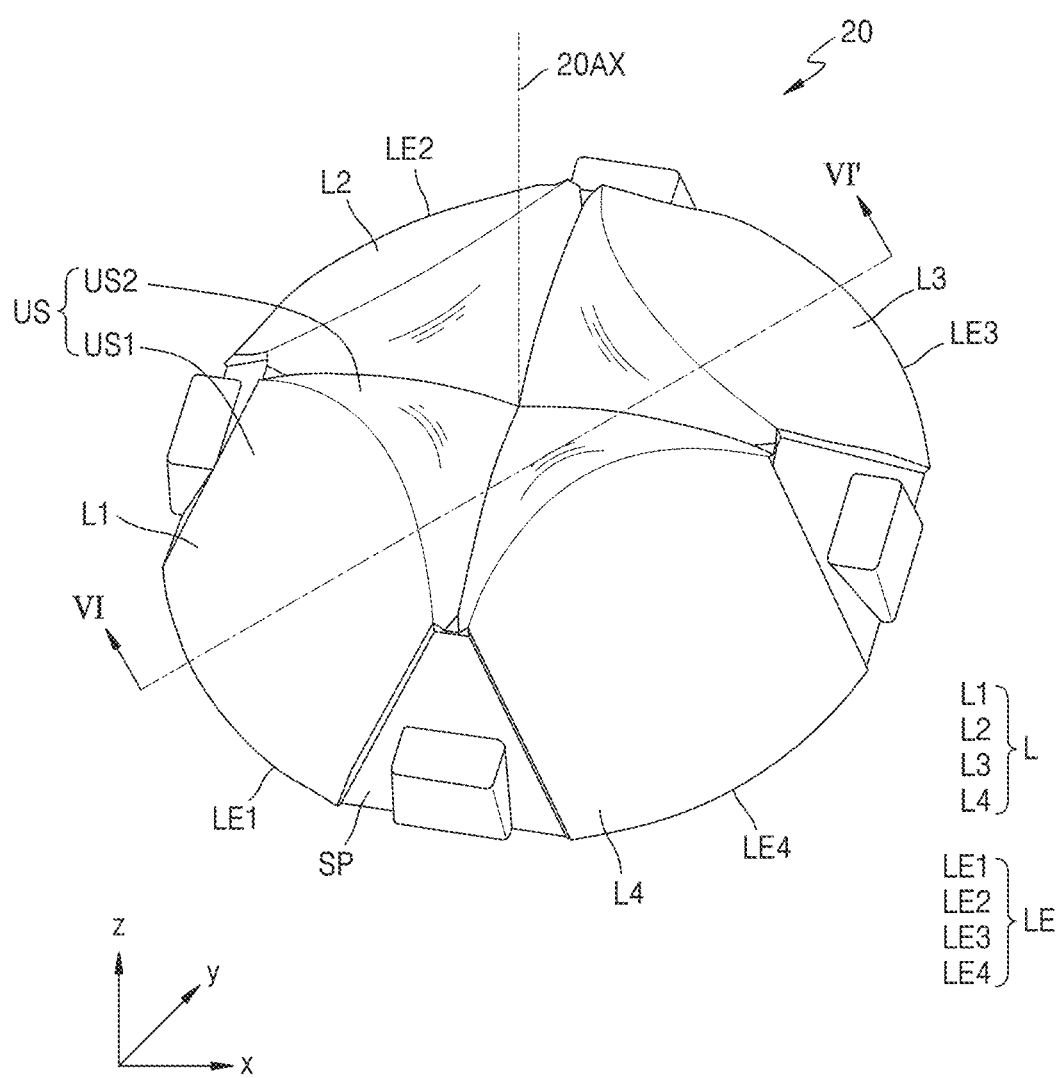
FIG. 5 is a perspective view schematically illustrating an optical unit according to an embodiment.
Figure 6:
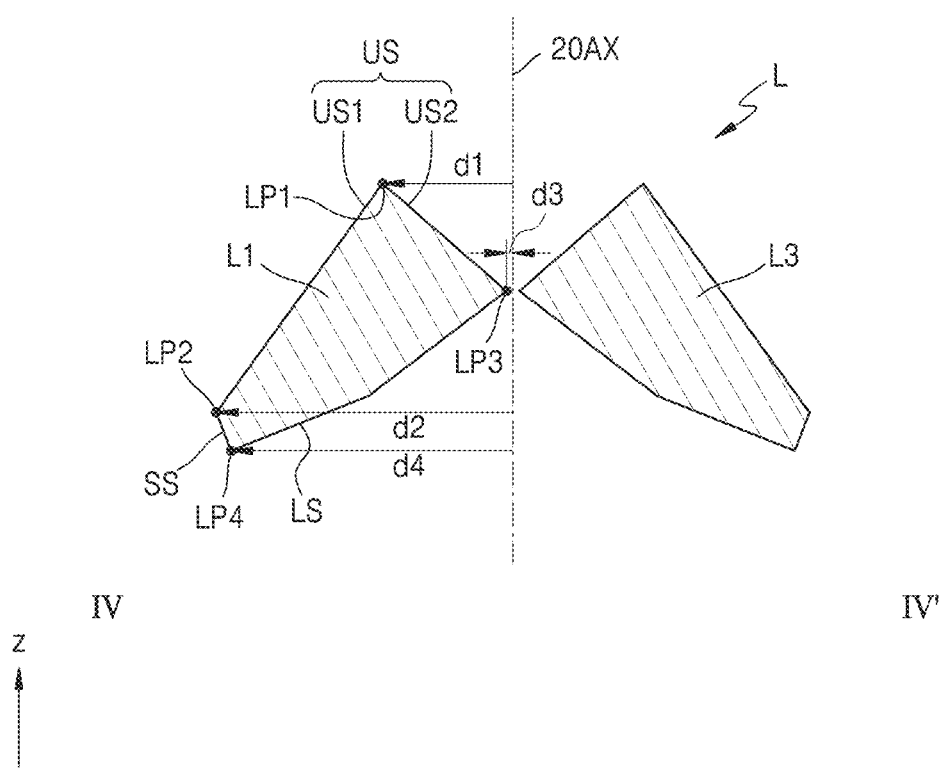
FIG. 6 is a schematic cross-sectional view of the optical unit taken along line VI-VI' of FIG. 5.

FIG. 5 is a perspective view schematically illustrating an optical unit 20 according to an embodiment. FIG. 6 is a schematic cross-sectional view of the optical unit 20 taken along line VI-VI' of FIG. 5.

Referring to FIGS. 5 and 6, the optical unit 20 may include a lens L and a support unit SP. The optical unit 20 may include a plurality of lenses L. In an embodiment, the plurality of lenses L may be separated from each other. In other embodiments, the plurality of lenses L may be integrally provided. In this case, the plurality of lenses L may be lens portions of the integrally provided lens L. In an embodiment, the optical unit 20 may include a first lens L1, a second lens L2, a third lens L3, and a fourth lens L4. In some embodiments, some of the first lens L1, the second lens L2, the third lens L3, and the fourth lens L4 may be omitted. In some embodiments, the optical unit 20 may further include a fifth lens or may include more lenses. Hereinafter, a detailed description will be mainly given of a case where the optical unit 20 includes a first lens L1, a second lens L2, a third lens L3, and a fourth lens L4.

The plurality of lenses L may be arranged adjacent to each other. For example, the first lens L1 and the second lens L2 may be arranged adjacent to each other. The second lens L2 and the third lens L3 may be arranged adjacent to each other. The third lens L3 and the fourth lens L4 may be arranged adjacent to each other. The fourth lens L4 and the first lens L1 may be arranged adjacent to each other.

The plurality of lenses L may be arranged surrounding a central axis 20AX of the optical unit 20. For example, the first lens L1, the second lens L2, the third lens L3, and the fourth lens L4 may be arranged surrounding the central axis 20AX of the optical unit 20. In an embodiment, the first lens L1 and the third lens L3 may be symmetrically arranged with respect to the central axis 20AX of the optical unit 20. The second lens L2 and the fourth lens L4 may be symmetrically arranged with respect to the central axis 20AX of the optical unit 20.

The plurality of lenses L may include a lens edge LE. The lens edge LE may be an end portion of the lenses L in a plan view (see FIG. 7 described below). The lens edge LE may be an end portion of the lenses L in the plan view. For example, the first lens L1 may include a first lens edge LE1. The second lens L2 may include a second lens edge LE2. The third lens L3 may include a third lens edge LE3. The fourth lens L4 may include a fourth lens edge LE4.

The lens edge LE may have a curved shape at least partially surrounding the central axis 20AX of the optical unit 20 in the plan view. The central axis 20AX of the optical unit 20 may extend in the third direction (e.g., z direction or −z direction). In an embodiment, the lens edge LE may have a convex shape in a direction from the central axis 20AX of the optical unit 20 to the lens edge LE. In an embodiment, the shape of the lens edge LE may be a portion of a circular shape. In another embodiment, the shape of the lens edge LE may be a portion of an elliptical shape.

Any one of the plurality of lenses L may include a lower surface LS, an upper surface US, and a side surface SS. The lower surface LS may be opposite to the upper surface US. That is, the lens L may include an upper surface US, a lower surface LS, and a side surface SS.

The upper surface US of the lens L may include a first upper surface US1 and a second upper surface US2. The first upper surface US1 may be flat. The second upper surface US2 may be a curved surface. The second upper surface US2 may include a curved edge to at least partially surround the first upper surface US1.

The first upper surface US1 may be connected to the second upper surface US2. The first upper surface US1 and the second upper surface US2 may be connected to at a first point LP1. The first upper surface US1 may intersect with the second upper surface US2. In an embodiment, the first upper surface US1 and the second upper surface US2 may be perpendicular to each other. In other embodiments, the first upper surface US1 and the second upper surface US2 may form an acute angle or an obtuse angle therebetween.

The first upper surface US1 may be connected to the side surface SS. The first upper surface US1 and the side surface SS may be connected to at a second point LP2. The first upper surface US1 may intersect with the side surface SS.

The first upper surface US1 may be inclined with respect to the central axis 20AX of the optical unit 20. The first upper surface US1 may extend in a direction intersecting with the central axis 20AX of the optical unit 20. In an embodiment, the first upper surface US1 may be inclined such that a first distance d1 from the central axis 20AX of the optical unit 20 to the first point LP1 may be less than a second distance d2 from the central axis 20AX of the optical unit 20 to the second point LP2.

The second upper surface US2 may be connected to the first upper surface US1 at the first point LP1. The second upper surface US2 may be connected to the lower surface LS at a third point LP3. The second upper surface US2 may intersect with the lower surface LS.

The second upper surface US2 may be inclined with respect to the central axis 20AX of the optical unit 20. The second upper surface US2 may extend in a direction intersecting with the central axis 20AX of the optical unit 20. In an embodiment, the second upper surface US2 may be inclined such that the first distance d1 from the central axis 20AX of the optical unit 20 to the first point LP1 may be greater than a third distance d3 from the central axis 20AX of the optical unit 20 to the third point LP3.

The lower surface LS may be connected to the second upper surface US2 at the third point LP3. The lower surface LS may be connected to the side surface SS. The lower surface LS may be connected to the side surface SS at a fourth point LP4. The lower surface LS may intersect with the side surface SS. In an embodiment, the lower surface LS may be bent. In other embodiments, the lower surface LS may have a curved surface.

The lower surface LS may be inclined with respect to the central axis 20AX of the optical unit 20. In an embodiment, the lower surface LS may be inclined such that the third distance d3 from the central axis 20AX of the optical unit 20 to the third point LP3 may be less than a fourth distance d4 from the central axis 20AX of the optical unit 20 to the fourth point LP4.

The lens L may include the upper surface US, the lower surface LS, and the side surface SS as above to refract and/or reflect the light passing through the lens L.

The support unit SP may maintain the shape of the optical unit 20. The support unit SP may support the plurality of lenses L. The support unit SP may support the first lens L1, the second lens L2, the third lens L3, and the fourth lens L4.

In an embodiment, the support unit SP may be provided as a plurality of support units. In an embodiment, the support unit SP may be arranged between the adjacent lenses L. For example, the support unit SP may be arranged between the first lens L1 and the second lens L2. The support unit SP may be arranged between the second lens L2 and the third lens L3. The support unit SP may be arranged between the third lens L3 and the fourth lens L4. The support unit SP may be arranged between the fourth lens L4 and the first lens L1.

Figure 7:
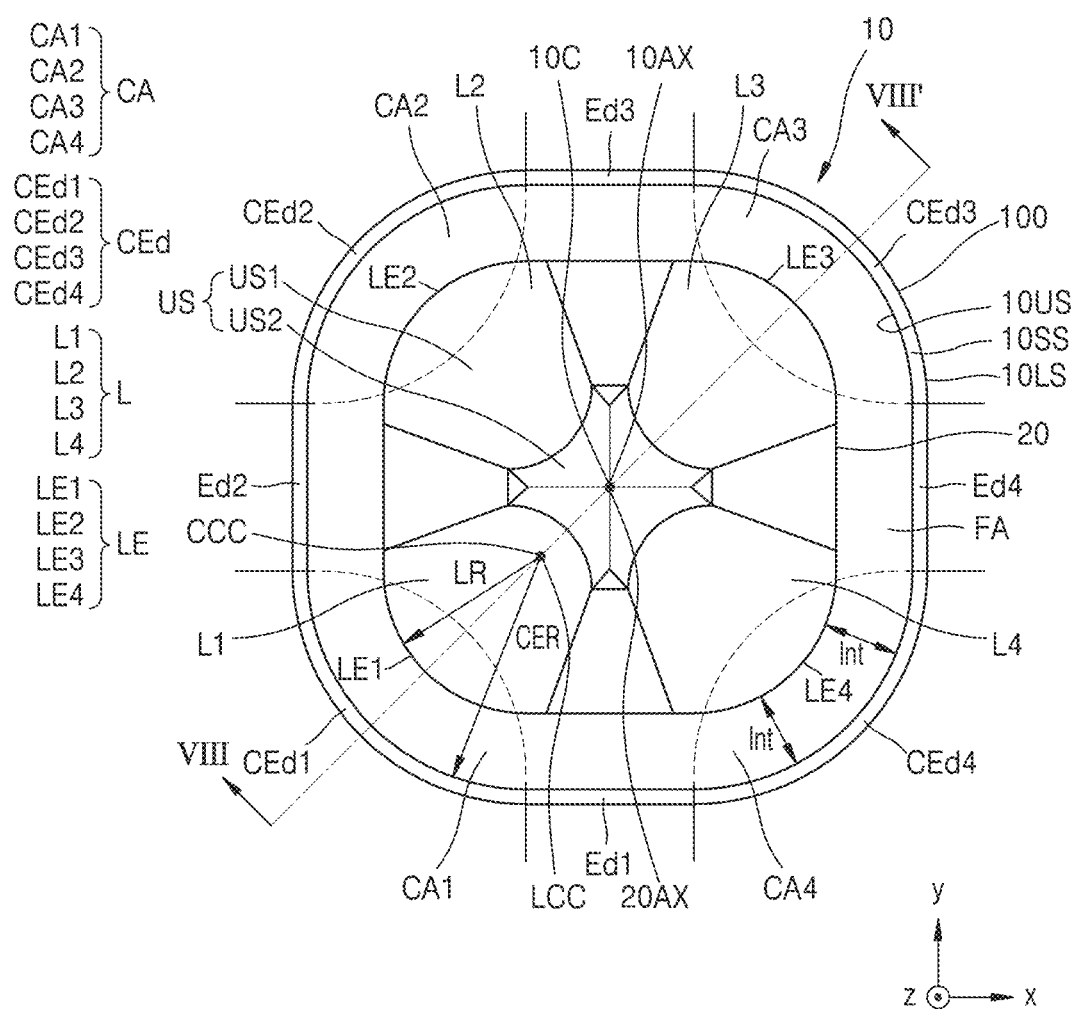
FIG. 7 is a plan view schematically illustrating a display panel and an optical unit according to an embodiment.
Figure 8A:
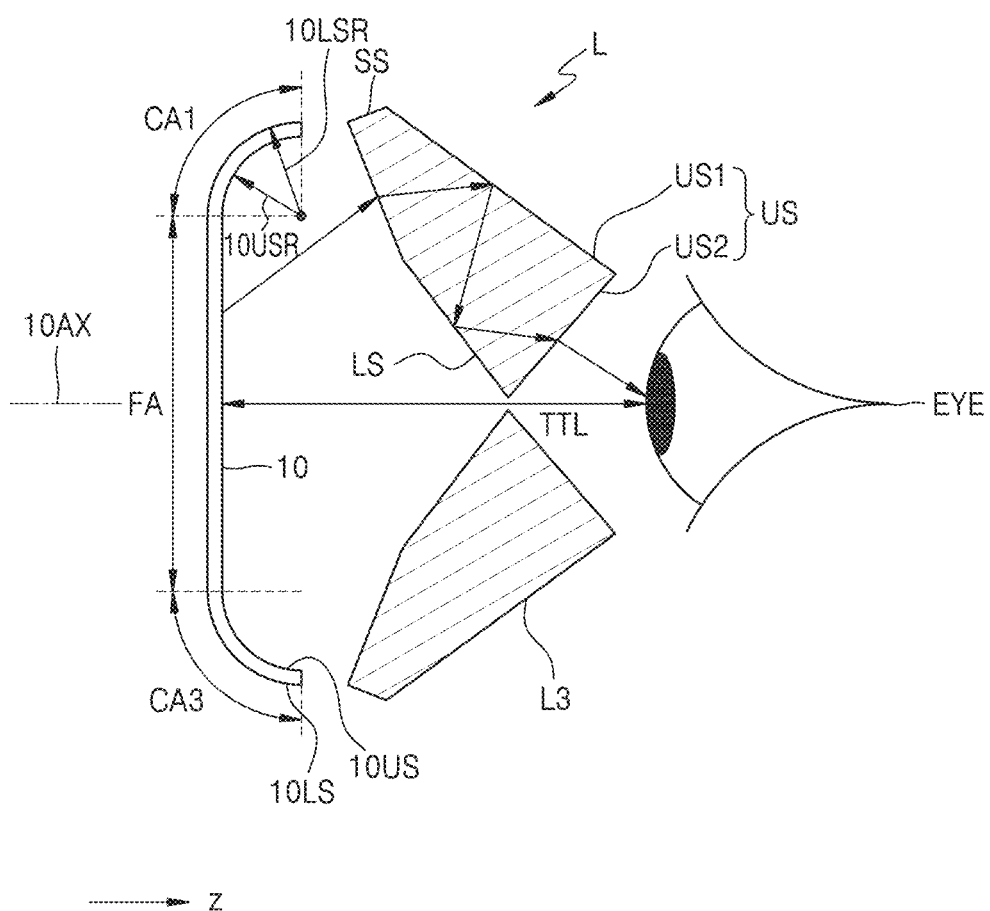
FIGS. 8A and 8B are cross-sectional views schematically illustrating a display panel and an optical unit according to an embodiment.
Figure 8B:
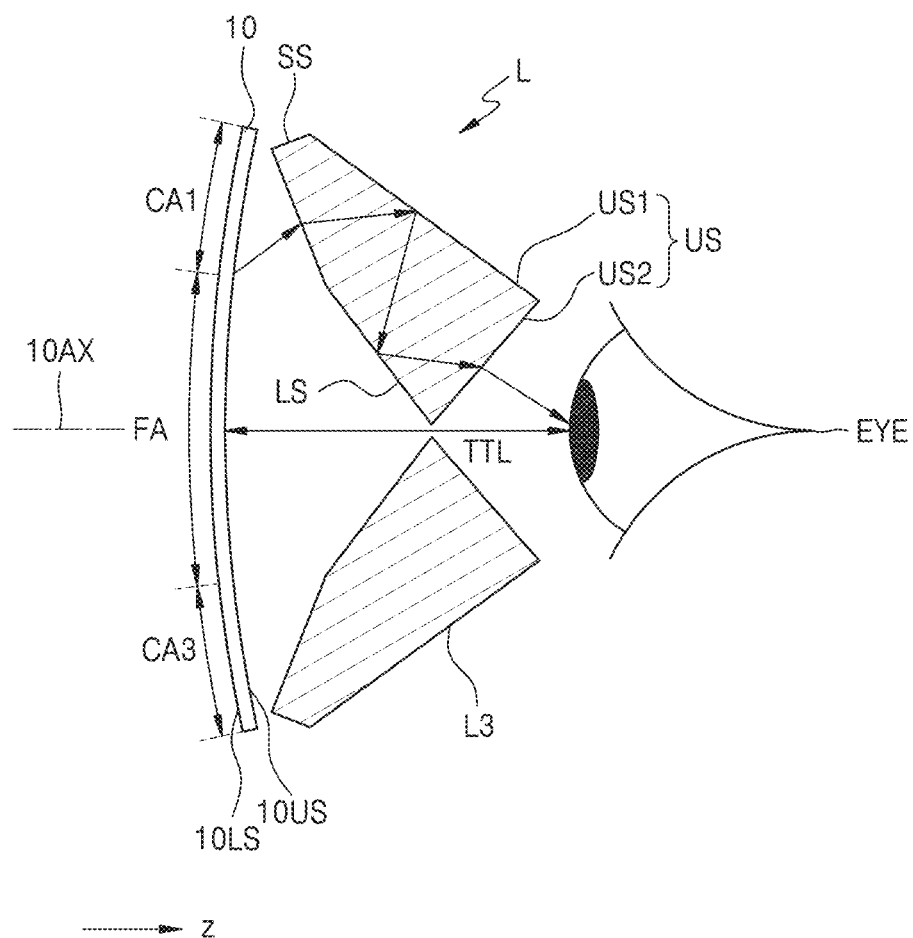

FIG. 7 is a plan view schematically illustrating a display panel 10 and an optical unit 20 according to an embodiment. FIGS. 8A and 8B are cross-sectional views schematically illustrating a display panel 10 and an optical unit 20 according to an embodiment. FIGS. 8A and 8B are schematic cross-sectional views of the display panel 10 and the optical unit 20 taken along line VIII-VIII' of FIG. 7. In FIGS. 7, 8A, and 8B, like reference numerals as those in FIGS. 3, 5, and 6 denote like members, and thus, redundant descriptions thereof will be omitted for conciseness.

Referring to FIG. 7, an electronic apparatus may include a display panel 10 and an optical unit 20. The display panel 10 may include a first edge Ed1 extending in a first direction (e.g., x direction or −x direction), a second edge Ed2 extending in a second direction (e.g., y direction or −y direction), and a corner edge CEd1 extending from the first edge Ed1 to the second edge Ed2.

The display panel 10 may include a substrate 100 and a pixel (not illustrated). The substrate 100 may include a front area FA and a corner area CA. The front area FA may overlap a center 10C of the display panel 10. The corner area CA may extend from the front area FA to the corner edge CEd. The pixel may be arranged over the substrate 100 to overlap the corner area CA. The pixel may be arranged over the substrate 100 to overlap the front area FA.

The display panel 10 may be curved in the corner area CA. In an embodiment, the display panel 10 may be curved in at least one of the first corner area CA1, the second corner area CA2, the third corner area CA3, and the fourth corner area CA4.

The display panel 10 may be curved in the corner area CA in a direction in which the corner edge CEd approaches the center 10C of the display panel 10. In an embodiment, the display panel 10 may be curved in the corner area CA in a direction in which the corner edge CEd approaches the central axis 10AX of the display panel 10. Thus, the display panel 10 may be at least partially curved toward the center 10C of the display panel 10 and/or the central axis 10AX of the display panel 10.

The optical unit 20 may include a plurality of lenses L. The plurality of lenses L may face the display panel 10. For example, the first lens L1, the second lens L2, the third lens L3, and the fourth lens L4 may face the display panel 10.

The plurality of lenses L may include a lens edge LE. The lens edge LE may be an end portion of the lenses L in the plan view. The lens edge LE may be an end portion of the lenses L in the plan view which is a view in a third direction (e.g., z direction or −z direction).

In an embodiment, the center 10C of the display panel 10 may overlap a central axis 20AX of the optical unit 20. The central axis 10AX of the display panel 10 may coincide with the central axis 20AX of the optical unit 20. The front area FA of the display panel 10 may overlap the optical unit 20 in the plan view.

The plurality of lenses L may face a plurality of corner areas CA, respectively. For example, the first lens L1 may face the first corner area CA1. The light emitted from the pixel arranged in the first corner area CA1 may pass through the first lens L1. The second lens L2 may face the second corner area CA2. The light emitted from the pixel arranged in the second corner area CA2 may pass through the second lens L2. The third lens L3 may face the third corner area CA3. The light emitted from the pixel arranged in the third corner area CA3 may pass through the third lens L3. The fourth lens L4 may face the fourth corner area CA4. The light emitted from the pixel arranged in the fourth corner area CA4 may pass through the fourth lens L4.

In the plan view, the lens edge LE of any one of the plurality of lenses L may extend while being spaced apart from the corner edge CEd by a uniform interval Int. The corner edge CEd may extend while being spaced apart from the lens edge LE by a uniform interval Int. In other words, the corner edge CEd may extend corresponding to the lens edge LE. The corner edge CEd may extend along the lens edge LE. Thus, the corner edge CEd and the lens edge LE may have similar shapes.

In an embodiment, the corner edge CEd may have a curved shape and/or a curved surface shape at least partially surrounding the center 10C of the display panel 10 and/or the central axis 10AX of the display panel 10. The corner edge CEd may have a curvature. In an embodiment, the corner edge CEd may have a corner curvature radius CER from a curvature center CCC of the corner edge CEd.

In an embodiment, the lens edge LE may have a curved shape at least partially surrounding the central axis 20AX of the optical unit 20. The lens edge LE may have a curvature. In an embodiment, the lens edge LE may have a lens curvature radius LR from a curvature center LCC of the lens edge LE.

In an embodiment, the curvature center LCC of the lens edge LE may coincide with the curvature center CCC of the corner edge CEd. The curvature center LCC of the lens edge LE may substantially coincide with the curvature center CCC of the corner edge CEd in the plan view. Thus, the lens edge LE may extend while being spaced apart from the corner edge CEd by a uniform interval Int, and the corner edge CEd and the lens edge LE may have shapes with a proportional relationship.

Referring to FIGS. 8A and 8B, the display panel 10 may be curved in a direction toward the plurality of lenses L. For example, the lower surface 10LS of the display panel 10 may be curved to at least partially surround the upper surface 10US of the display panel 10. In an embodiment, a curvature radius 10LSR of the lower surface 10LS of the display panel 10 may be greater than a curvature radius 10USR of the upper surface 10US of the display panel 10. Although not illustrated, in other embodiments, the display panel 10 may be curved in a direction away from the plurality of lenses L. For example, the upper surface 10US of the display panel 10 may be curved to at least partially surround the lower surface 10LS of the display panel 10. The curvature radius 10USR of the upper surface 10US of the display panel 10 may be greater than the curvature radius 10LSR of the lower surface 10LS of the display panel 10.

Referring to FIG. 8A, the display panel 10 may be flat in the front area FA. In this case, each of the upper surface 10US of the display panel 10 and the lower surface 10LS of the display panel 10 may extend in one direction in the front area FA.

Referring to FIG. 8B, the display panel 10 may be curved in a dome shape in the front area FA. The display panel 10 may be convex downward in the front area FA. FIG. 8B illustrates a case where the curvature of the upper surface 10US of the display panel 10 in the front area FA is equal to the curvature of the upper surface 10US of the display panel 10 in the first corner area CA1 and/or the third corner area CA3.

In an embodiment, the display panel 10 may be curved in the corner area CA to reduce a screen distortion viewed by the user. When the display panel 10 is generally flat, the user may view a screen distortion in the corner area CA of the display panel 10 due to the focal distance between the lens L and the display panel 10. According to the embodiment, because the display panel 10 is suitably curved in the corner area CA, the screen distortion may be prevented or reduced.

In an embodiment, the lens L may include a lower surface LS, an upper surface US, and a side surface SS. In this case, light emitted from the display panel 10 may be incident on the lower surface LS. In this case, the light may be refracted at the lower surface LS. Next, the light may pass through the inside of the lens L and may be reflected at the first upper surface US1. In an embodiment, the light may be totally reflected at the first upper surface US1. Next, the light may again pass through the inside of the lens L and may be reflected at the lower surface LS. In an embodiment, the light may be totally reflected at the lower surface LS. Next, the light may be emitted through the second upper surface US2. The light may be refracted at the second upper surface US2. Next, the light may be incident on a user's eye EYE. Thus, the user may perceive the light emitted from the display panel 10.

When the lens L described above is used, a total track length TTL from the upper surface 10US of the display panel 10 to the user's eye EYE may be reduced. The total track length TTL from the upper surface 10US of the display panel 10 to the user's eye EYE may be defined as the distance from the upper surface 10US of the display panel 10 to the user's eye EYE in the direction of the central axis 10AX of the display panel 10. In an embodiment, the total track length TTL may be about 30 millimeters (mm) or less. Thus, the thickness of the electronic apparatus may be reduced.

In an embodiment, the corner edge CEd may have a curved shape at least partially surrounding the center 10C of the display panel 10 and/or the central axis 10AX of the display panel 10. Also, in the plan view, the lens edge LE of any one of the plurality of lenses L may extend while being spaced apart from the corner edge CEd by a uniform interval Int. Thus, a portion of the display panel 10 in which a relatively large amount of distortion occurs may be removed, and the display panel 10 and the optical unit 20 arranged in the electronic apparatus 1 may be efficiently utilized. For example, the space utilization inside the case unit 30 of the electronic apparatus 1 may increase.

Figure 9B:
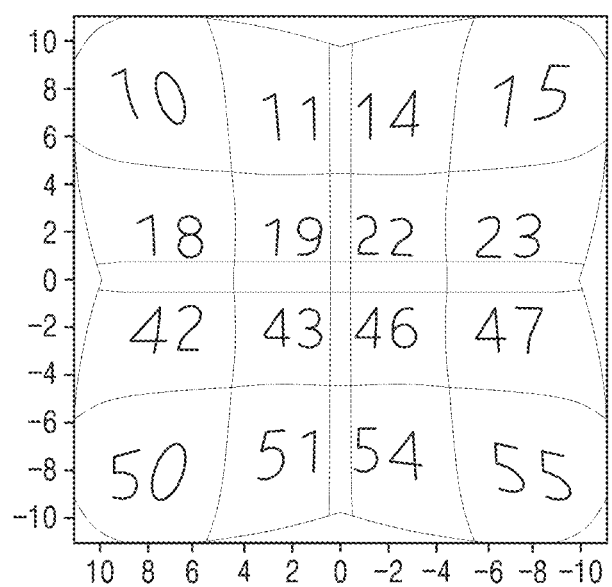
FIG. 9B illustrates an example of an image recognized by a user through an optical unit after being displayed on a display panel according to a comparative example.

FIG. 9A illustrates an example of an image displayed on a display panel. FIG. 9B illustrates an example of an image recognized by a user through an optical unit after being displayed on a display panel according to a comparative example. The display panel according to a comparative example may be a generally flat display panel.

Referring to FIGS. 9A and 9B, the user may recognize an image displayed on the generally flat display panel, through the optical unit. In this case, as illustrated in FIG. 9B, the user may perceive a screen distortion. For example, the screen distortion may increase in a diagonal direction away from the center of FIG. 9A. For example, images 10, 15, 50, and 55 may be distorted more severely than images 19, 22, 43, and 46. This may be because the optical unit including the plurality of lenses L described with reference to FIGS. 8A and 8B is used to reduce the total track length TTL from the upper surface 10US of the display panel 10 to the user's eye EYE.

The display panel according to an embodiment may be curved in the corner area in a direction in which the corner edge approaches the center of the display panel. Particularly, the display panel 10 may be curved in at least one of the first corner area CA1, the second corner area CA2, the third corner area CA3, and the fourth corner area CA4. Also, the plurality of lenses L may face the plurality of corner areas CA, respectively. Thus, the screen distortion viewed by the user may be reduced. According to an embodiment, the total track length TTL from the upper surface 10US of the display panel 10 to the user's eye EYE may be reduced while reducing the screen distortion viewed by the user. Thus, the thickness of the electronic apparatus 1 may be effectively reduced.

Figure 10:
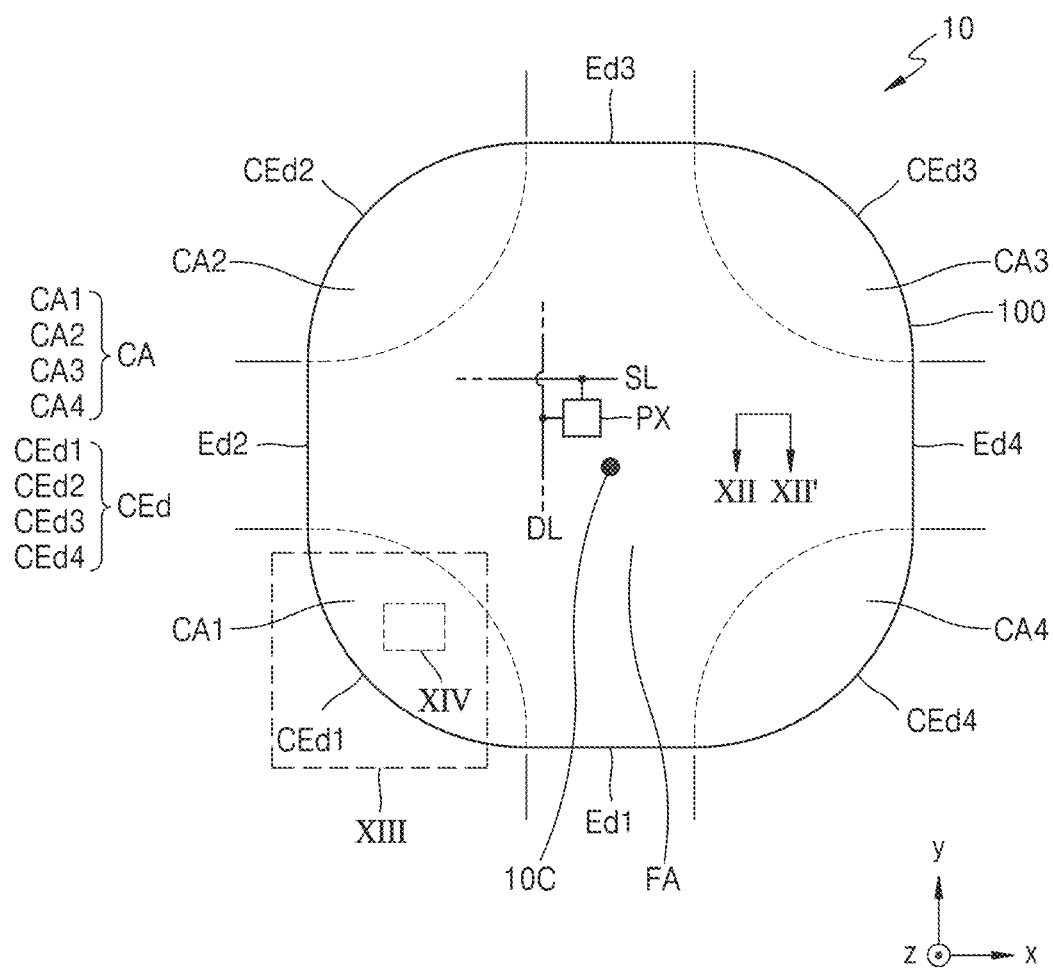
FIG. 10 is a plan view schematically illustrating a display panel according to an embodiment.

FIG. 10 is a plan view schematically illustrating a display panel 10 according to an embodiment. FIG. 10 is a plan view schematically illustrating an unbent shape of the display panel 10 as a shape of the display panel 10 before the corner area CA is curved.

Referring to FIG. 10, the display panel 10 may include an edge. The edge may be an end portion of the display panel 10. In an embodiment, the display panel 10 may include a first edge Ed1, a second edge Ed2, a third edge Ed3, a fourth edge Ed4, and a corner edge CEd. The first edge Ed1 and/or the third edge Ed3 may extend in a first direction. The second edge Ed2 and/or the fourth edge Ed4 may extend in a second direction intersecting with the first direction.

The corner edge CEd may extend between the adjacent edges. The corner edge CEd may have a curved shape at least partially surrounding a center 10C of the display panel 10. In an embodiment, the corner edge CEd may include a first corner edge CEd1, a second corner edge CEd2, a third corner edge CEd3, and a fourth corner edge CEd4.

The display panel 10 may include a substrate 100. The substrate 100 may include a front area FA and a corner area CA. The corner area CA may extend from the front area FA to the corner edge CEd. The corner area CA may include the corner edge CEd.

The corner areas CA may be provided as a plurality of corner areas. In an embodiment, the corner area CA may include a first corner area CA1, a second corner area CA2, a third corner area CA3, and a fourth corner area CA4.

A pixel PX may be arranged over the substrate 100. In an embodiment, the pixel PX may be arranged over the substrate 100 to overlap the corner area CA. In an embodiment, the pixel PX may be arranged over the substrate 100 to overlap the front area FA.

In an embodiment, the pixel PX may be connected to a scan line SL extending in the first direction (e.g., x direction or −x direction). In an embodiment, the pixel PX may be connected to a data line DL extending in the second direction (e.g., y direction or −y direction).

The display panel 10 may include a plurality of pixels PX, and the display panel 10 may display an image by using the plurality of pixels PX. Each of the pixels PX may include subpixels, and the subpixels may emit light of a certain color by using a display element. In the specification, the subpixel may refer to an emission area as a minimum unit for implementing an image.

Each of the plurality of pixels PX may include a display element. The display panel 10 may be an organic light emitting display panel using an organic light emitting diode including an organic emission layer. Alternatively, the display panel 10 may be a light emitting diode display panel using a light emitting diode LED. The size of the light emitting diode LED may be a micro scale or a nano scale. For example, the light emitting diode may be a micro light emitting diode. Alternatively, the light emitting diode may be a nanorod light emitting diode. The nanorod light emitting diode may include gallium nitride (GaN). In an embodiment, a color conversion layer may be arranged over the nanorod light emitting diode. The color conversion layer may include quantum dots. Alternatively, the display panel 10 may be a quantum dot light emitting display panel using a quantum dot light emitting diode including a quantum dot emission layer. Alternatively, the display panel 10 may be an inorganic light emitting display panel using an inorganic light emitting diode including an inorganic semiconductor. Hereinafter, a detailed description will be mainly given of a case where the display panel 10 is an organic light emitting display panel using an organic light emitting diode as a display element.

Figure 11:
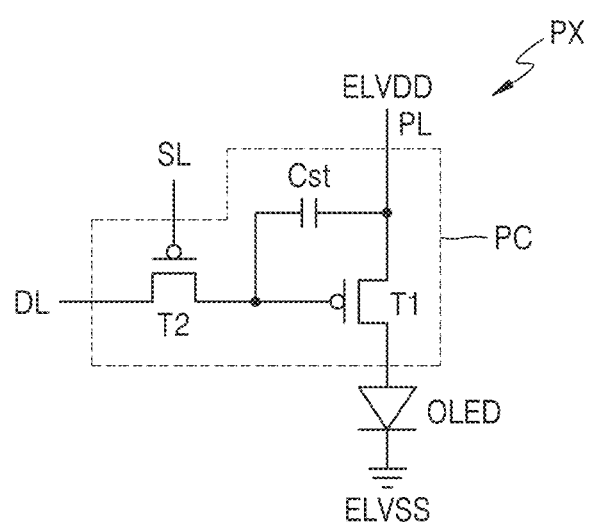
FIG. 11 is an equivalent circuit diagram schematically illustrating a pixel circuit applicable to a display panel and an organic light emitting diode connected to the pixel circuit.

FIG. 11 is an equivalent circuit diagram schematically illustrating a pixel circuit PC applicable to a display panel and an organic light emitting diode OLED connected to the pixel circuit PC.

Referring to FIG. 11, the pixel circuit PC may be connected to a display element, for example, an organic light emitting diode OLED. In an embodiment, the pixel circuit PC and the organic light emitting diode OLED may implement a pixel PX. The pixel PX may include a pixel circuit PC and an organic light emitting diode OLED.

The pixel circuit PC may include a driving thin film transistor T1, a switching thin film transistor T2, and a storage capacitor Cst. Also, the organic light emitting diode OLED may emit red, green, or blue light or may emit red, green, blue, or white light.

The switching thin film transistor T2 may be connected to a scan line SL and a data line DL and may be configured to transmit a data voltage or a data signal input from the data line DL to the driving thin film transistor T1 according to a switching voltage or a scan signal input from the scan line SL. The storage capacitor Cst may be connected to the switching thin film transistor T2 and a driving voltage line PL and may store a voltage corresponding to the difference between a voltage received from the switching thin film transistor T2 and a first power voltage ELVDD supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current. An opposite electrode of the organic light emitting diode OLED may be supplied with a second power voltage ELVSS.

Although FIG. 11 illustrates that the pixel circuit PC includes two thin film transistors and one storage capacitor, the pixel circuit PC may include three, four, five, or more thin film transistors.

Figure 12:
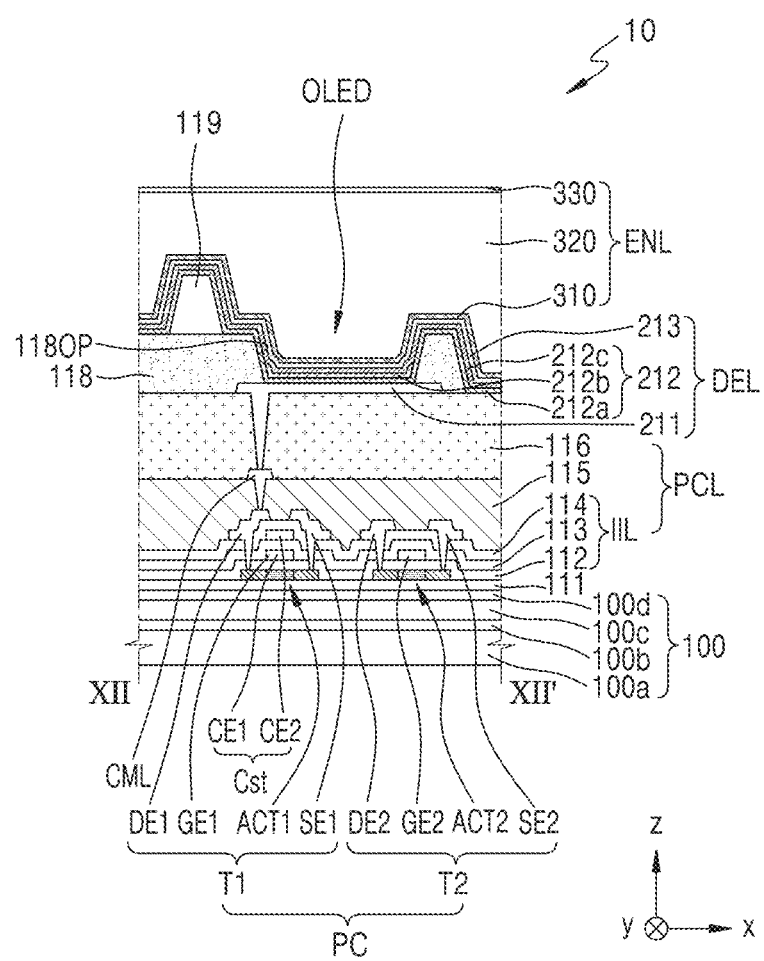
FIG. 12 is a schematic cross-sectional view of a display panel taken along line XII-XII' of FIG. 10, according to an embodiment.

FIG. 12 is a schematic cross-sectional view of a display panel 10 taken along line XII-XII' of FIG. 10, according to an embodiment.

Referring to FIG. 12, the display panel 10 may include a substrate 100, a buffer layer 111, a pixel circuit layer PCL, a display element layer DEL, and an encapsulation layer ENL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in the substrate 100. In other embodiments, the substrate 100 may include glass.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may be barrier layers for preventing penetration of external foreign substances and may include a single layer or multiple layers including an inorganic material such as silicon nitride ($SiN_x$), silicon oxide ($SiO_2$), and/or silicon oxynitride (SiON).

The buffer layer 111 may be arranged over the substrate 100. The buffer layer 111 may include an inorganic insulating material such as silicon nitride ($SiN_x$), silicon oxynitride (SiON), and silicon oxide ($SiO_2$) and may be a single layer or multiple layers including the inorganic insulating material.

The pixel circuit layer PCL may be arranged over the buffer layer 111. The pixel circuit layer PCL may include a pixel circuit PC. The pixel circuit PC may include a driving thin film transistor T1, a switching thin film transistor T2, and a storage capacitor Cst.

The pixel circuit layer PCL may include an inorganic insulating layer IIL, a first organic insulating layer 115, and a second organic insulating layer 116 arranged under and/or over the components of the driving thin film transistor T1. The inorganic insulating layer IIL may include a first gate insulating layer 112, a second gate insulating layer 113, and an interlayer insulating layer 114. The driving thin film transistor T1 may include a first semiconductor layer ACT1, a first gate electrode GE1, a first source electrode SE1, and a first drain electrode DE1.

The first semiconductor layer ACT1 may include polysilicon. Alternatively, the first semiconductor layer ACT1 may include amorphous silicon, may include an oxide semiconductor, or may include an organic semiconductor or the like. The first semiconductor layer ACT1 may include a channel area and a drain area and a source area arranged on opposite sides of the channel area, respectively.

The first gate electrode GE1 may overlap the channel area. The first gate electrode GE1 may include a low-resistance metal material. The first gate electrode GE1 may include a conductive material including molybdenum (Mo), aluminum (Al), copper (Cu), titanium (Ti), or the like and may include a single layer or multiple layers including the above material.

The first gate insulating layer 112 between the first semiconductor layer ACT1 and the first gate electrode GE1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may be provided to cover the first gate electrode GE1. Like the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of the storage capacitor Cst may be arranged over the second gate insulating layer 113. The upper electrode CE2 may overlap the first gate electrode GE1 thereunder. In this case, the upper electrode CE2 and the first gate electrode GE1 of the driving thin film transistor T1 overlapping each other with the second gate insulating layer 113 therebetween may form the storage capacitor Cst. That is, the first gate electrode GE1 of the driving thin film transistor T1 may function as a lower electrode CE1 of the storage capacitor Cst.

As such, the storage capacitor Cst and the driving thin film transistor T1 may be disposed to overlap each other. In some embodiments, the storage capacitor Cst may be disposed not to overlap the driving thin film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide (ZnO). The interlayer insulating layer 114 may include a single layer or a multiple layer including the above inorganic insulating material.

Each of the first drain electrode DE1 and the first source electrode SE1 may be arranged over the interlayer insulating layer 114. Each of the first drain electrode DE1 and the first source electrode SE1 may include a high-conductivity material. The first drain electrode DE1 and the first source electrode SE1 may include a conductive material including molybdenum (Mo), aluminum (Al), copper (Cu), titanium (Ti), or the like and may include a single layer or multiple layers including the above material. In an embodiment, the first drain electrode DE1 and the first source electrode SE1 may include a multilayer structure of Ti/Al/Ti.

The switching thin film transistor T2 may include a second semiconductor layer ACT2, a second gate electrode GE2, a second drain electrode DE2, and a second source electrode SE2. The second semiconductor layer ACT2, the second gate electrode GE2, the second drain electrode DE2, and the second source electrode SE2 may be similar to the first semiconductor layer ACT1, the first gate electrode GE1, the first drain electrode DE1, and the first source electrode SE1, respectively, and thus, redundant descriptions thereof will be omitted for conciseness.

The first organic insulating layer 115 may be arranged to cover the first drain electrode DE1 and the first source electrode SE1. The first organic insulating layer 115 may include an organic material. For example, the first organic insulating layer 115 may include an organic insulating material such as a general-purpose polymer such as polymethylmethacrylate ("PMMA") or polystyrene ("PS"), a polymer derivative having a phenolic group, an acryl-based polymer, an imide-based polymer, an arylether-based polymer, an amide-based polymer, a fluorine-based polymers, a p-xylene-based polymer, a vinyl alcohol-based polymer, or any blend thereof.

A connection electrode CML may be arranged over the first organic insulating layer 115. In this case, the connection electrode CML may be connected to the first drain electrode DE1 or the first source electrode SE1 through a contact hole of the first organic insulating layer 115. The connection electrode CML may include a high-conductivity material. The connection electrode CML may include a conductive material including molybdenum (Mo), aluminum (Al), copper (Cu), titanium (Ti), or the like and may include a single layer or multiple layers including the above material. In an embodiment, the connection electrode CML may include a multilayer structure of Ti/Al/Ti.

The second organic insulating layer 116 may be arranged to cover the connection electrode CML. The second organic insulating layer 116 may include an organic material. The second organic insulating layer 116 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or any blend thereof.

The display element layer DEL may be arranged over the pixel circuit layer PCL. The display element layer DEL may include an organic light emitting diode OLED.

A pixel electrode 211 of the organic light emitting diode OLED may be electrically connected to the connection electrode CML through a contact hole of the second organic insulating layer 116. The pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In other embodiments, the pixel electrode 211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In other embodiments, the pixel electrode 211 may further include a layer formed of or including ITO, IZO, ZnO, or $In_2O_3$ over/under the reflection layer.

A pixel definition layer 118 defining an opening 118OP exposing a central portion of the pixel electrode 211 may be arranged over the pixel electrode 211. The pixel definition layer 118 may include an organic insulating material and/or an inorganic insulating material. The opening 118OP may define an emission area of light emitted from the organic light emitting diode OLED. For example, the width of the opening 118OP may correspond to the width of the emission area.

A spacer 119 may be arranged over the pixel definition layer 118. In the case of a method of manufacturing the display panel 10, a mask sheet may be used, and in this case, the mask sheet may enter the opening 118OP of the pixel definition layer 118 or may contact the pixel definition layer 118. The spacer 119 may prevent a defect in which a portion of the multilayer and the substrate 100 is damaged by the mask sheet when a deposition material is deposited on the substrate 100.

The spacer 119 may include an organic material such as polyimide. Alternatively, the spacer 119 may include an inorganic insulating material such as silicon nitride ($SiN_x$) or silicon oxide ($SiO_2$) or may include an organic insulating material and an inorganic insulating material.

In an embodiment, the spacer 119 may include a different material from the material of the pixel definition layer 118. Alternatively, in other embodiments, the spacer 119 may include the same material as the pixel definition layer 118, and in this case, the pixel definition layer 118 and the spacer 119 may be formed together in a mask process using a halftone mask or the like.

An intermediate layer 212 may be arranged over the pixel definition layer 118. The intermediate layer 212 may include an emission layer 212b arranged in the opening 118OP of the pixel definition layer 118. The emission layer 212b may include a high-molecular or low-molecular weight organic material for emitting light of a certain color.

A first functional layer 212a and a second functional layer 212c may be arranged under and over the emission layer 212b, respectively. The first functional layer 212a may include, for example, a hole transport layer ("HTL") or may include an HTL and a hole injection layer ("HIL"). The second functional layer 212c may be a component arranged over the emission layer 212b and may be optional. The second functional layer 212c may include an electron transport layer ("ETL") and/or an electron injection layer ("EIL"). Like an opposite electrode 213 described below, the first functional layer 212a and/or the second functional layer 212c may be a common layer to entirely cover the substrate 100.

An opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer such as ITO, IZO, ZnO, or $In_2O_3$ over the (semi)transparent layer including the above material.

In some embodiments, a capping layer (not illustrated) may be further arranged over the opposite electrode 213. The capping layer may include LiF, an inorganic material, and/or an organic material.

The encapsulation layer ENL may be arranged over the opposite electrode 213. In an embodiment, the encapsulation layer ENL may include at least one inorganic encapsulation layer and at least one organic encapsulation layer. In an embodiment, FIG. 12 illustrates that the encapsulation layer ENL includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials among aluminum oxide ($Al_2O_3$), titanium oxide ($TiO_2$), tantalum oxide ($Ta_2O_5$), hafnium oxide ($HfO_2$) zinc oxide (ZnO), silicon oxide ($SiO_2$), silicon nitride ($SiN_x$), and silicon oxynitride (SiON). The organic encapsulation layer 320 may include a polymer-based material. The polymer-based material may include acryl-based resin, epoxy-based resin, polyimide, polyethylene, or the like. In an embodiment, the organic encapsulation layer 320 may include acrylate.

Although not illustrated, a touch electrode layer may be arranged over the encapsulation layer ENL, and an optical functional layer may be arranged over the touch electrode layer. The touch electrode layer may be configured to obtain coordinate information according to an external input, for example, a touch event. The optical functional layer may reduce the reflectance of light (external light) incident from the outside toward the display apparatus and/or may improve the color purity of light emitted from the display apparatus. In an embodiment, the optical functional layer may include a phase retarder and/or a polarizer. The phase retarder may be a film type or a liquid crystal coating type and may include a λ/2 phase retarder and/or a λ/4 phase retarder. The polarizer may also be a film type or a liquid crystal coating type. The film type may include a stretched synthetic resin film, and the liquid crystal coating type may include liquid crystals arranged in a certain arrangement. The phase retarder and the polarizer may further include a protection film.

In other embodiments, the optical functional layer may include a black matrix and color filters. The color filters may be arranged in consideration of the color of light emitted from each of the pixels of the display panel. Each of the color filters may include a red, green, or blue pigment or dye. Alternatively, each of the color filters may further include quantum dots in addition to the above pigment or dye. Alternatively, some of the color filters may not include the above pigment or dye and may include scattering particles such as titanium oxide.

In other embodiments, the optical functional layer may include a destructive interference structure. The destructive interference structure may include a first reflection layer and a second reflection layer arranged on different layers. First reflected light and second reflected light reflected by the first reflection layer and the second reflection layer, respectively, may destructively interfere with each other, and accordingly, the external light reflectance may be reduced.

An adhesive member may be arranged between the touch electrode layer and the optical functional layer. The adhesive member may include a general one known in the art, without limitation. The adhesive member may include a pressure sensitive adhesive ("PSA").

In an embodiment, the stack structure of the display panel 10 of FIG. 12 may be generally used in the front area FA and the corner area CA of FIG. 10. In other embodiments, the stack structure of the display panel 10 in the front area FA may be different from the stack structure of the display panel 10 in the corner area CA. Hereinafter, a detailed description will be mainly given of a case where the stack structure of the display panel 10 in the front area FA is different from the stack structure of the display panel 10 in the corner area CA.

Figure 13:
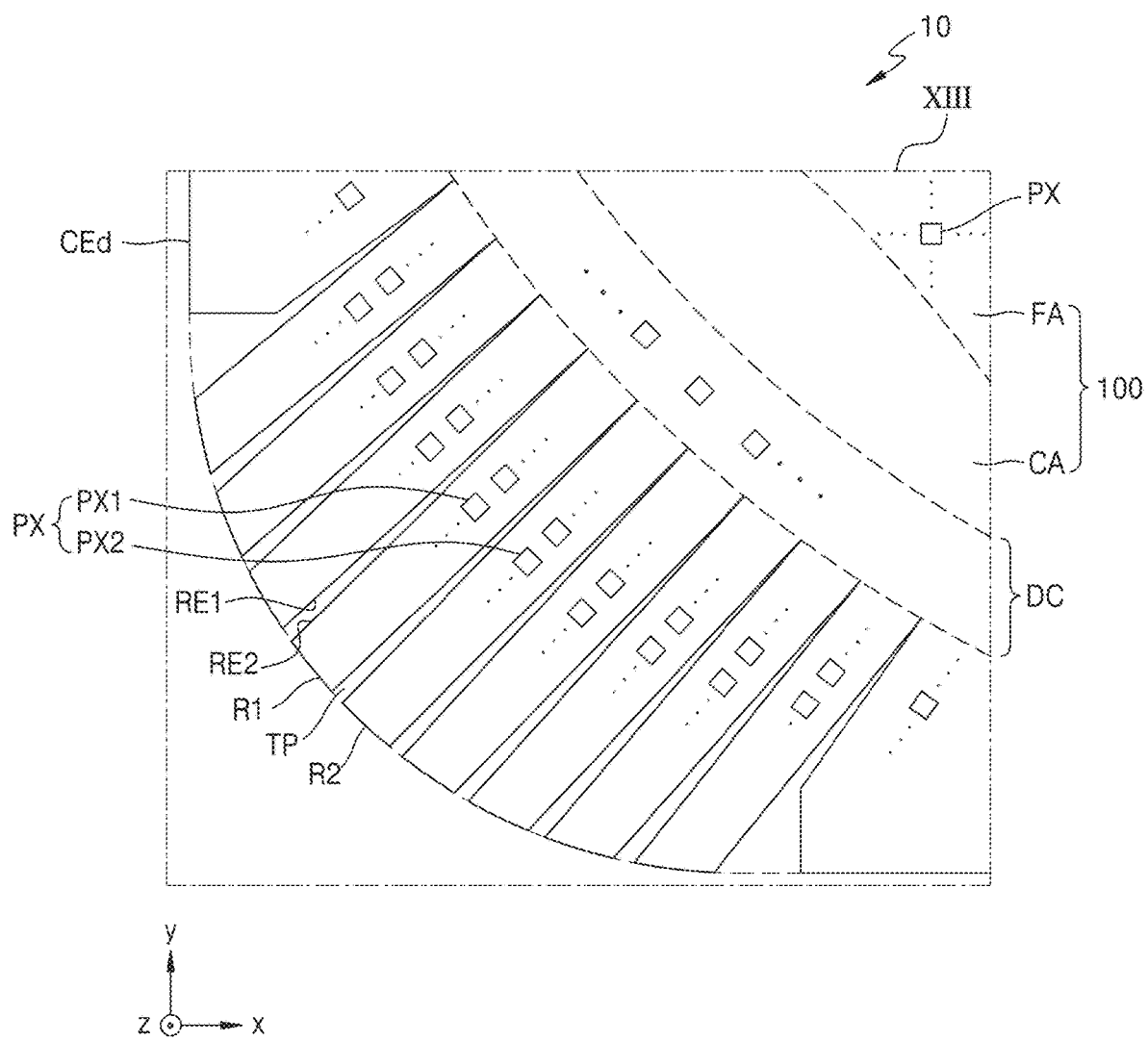
FIG. 13 is a plan view schematically illustrating a corner area according to an embodiment.

FIG. 13 is a plan view schematically illustrating a corner area CA according to an embodiment. FIG. 13 is an enlarged view of region XIII of the display panel 10 of FIG. 10.

Referring to FIG. 13, the display panel 10 may include an edge. The edge may be an end portion of the display panel 10. In an embodiment, the display panel 10 may include a corner edge CEd.

The display panel 10 may include a substrate 100. The substrate 100 may include a front area FA and a corner area CA. The corner area CA may extend from the front area FA to the corner edge CEd.

The corner area CA may include a first area R1 and a second area R2 spaced apart from each other. In an embodiment, the display panel 10 may provide a through-portion TP at least partially defined by an edge RE1 of the first area R1 and an edge RE2 of the second area R2. The edge RE1 of the first area R1 may be an end portion of the first area R1. The edge RE2 of the second area R2 may be an end portion of the second area R2.

The through-portion TP may pass through the display panel 10. Thus, the components of the display panel 10 may not be arranged in the through-portion TP. Because the through-portion TP is defined between the first area R1 and the second area R2 adjacent to each other, when the display panel 10 is curved, the first area R1 and the second area R2 may be stretched or contracted. That is, in FIG. 13, the through-portion TP may be an empty space between the first area R1 and the second area R2. Thus, when the display panel 10 is curved in the corner area CA, the display panel 10 may be curved without damage and the through-portion TP may improve the flexibility of the display panel 10.

In an embodiment, each of the first area R1 and the second area R2 may extend from the front area FA to the corner edge CEd. Each of the first area R1 and the second area R2 may extend in a direction away from the front area FA. In this case, the edge RE1 of the first area R1 and the edge RE2 of the second area R2 may face each other.

A pixel PX may be arranged over the substrate 100. In an embodiment, the pixel PX may be arranged over the substrate 100 to overlap at least one of the corner area CA and the front area FA.

In an embodiment, the pixel PX may include a first pixel PX1 and a second pixel PX2. The first pixel PX1 may be arranged over the substrate 100 to overlap the first area R1. A plurality of first pixels PX1 may be provided in the first area R1. The second pixel PX2 may be arranged over the substrate 100 to overlap the second area R2. A plurality of second pixels PX2 may be provided in the second area R2. The first pixel PX1 and the second pixel PX2 may face each other with the through-portion TP therebetween.

In an embodiment, a driving circuit DC for driving the pixel PX may be arranged in the corner area CA. In this case, a portion of the pixel PX may overlap the driving circuit DC. The driving circuit DC may be a scan driving circuit for providing a scan signal to each pixel PX through a scan line. Alternatively, the driving circuit DC may be a data driving circuit (not illustrated) for providing a data signal to each pixel PX through a data line. In some embodiments, the driving circuit DC may be omitted.

Figure 14A:
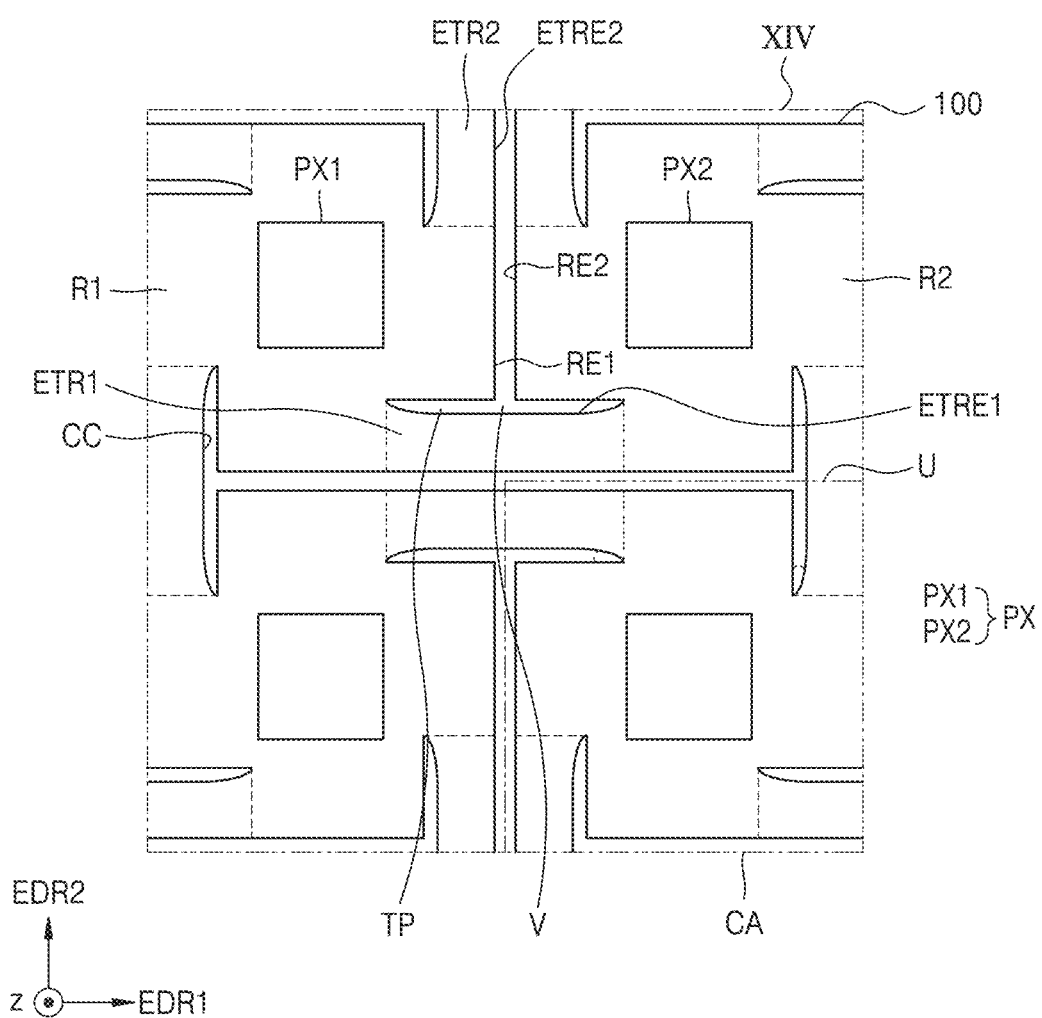
FIGS. 14A and 14B are plan views schematically illustrating a corner area according to an embodiment.
Figure 14B:
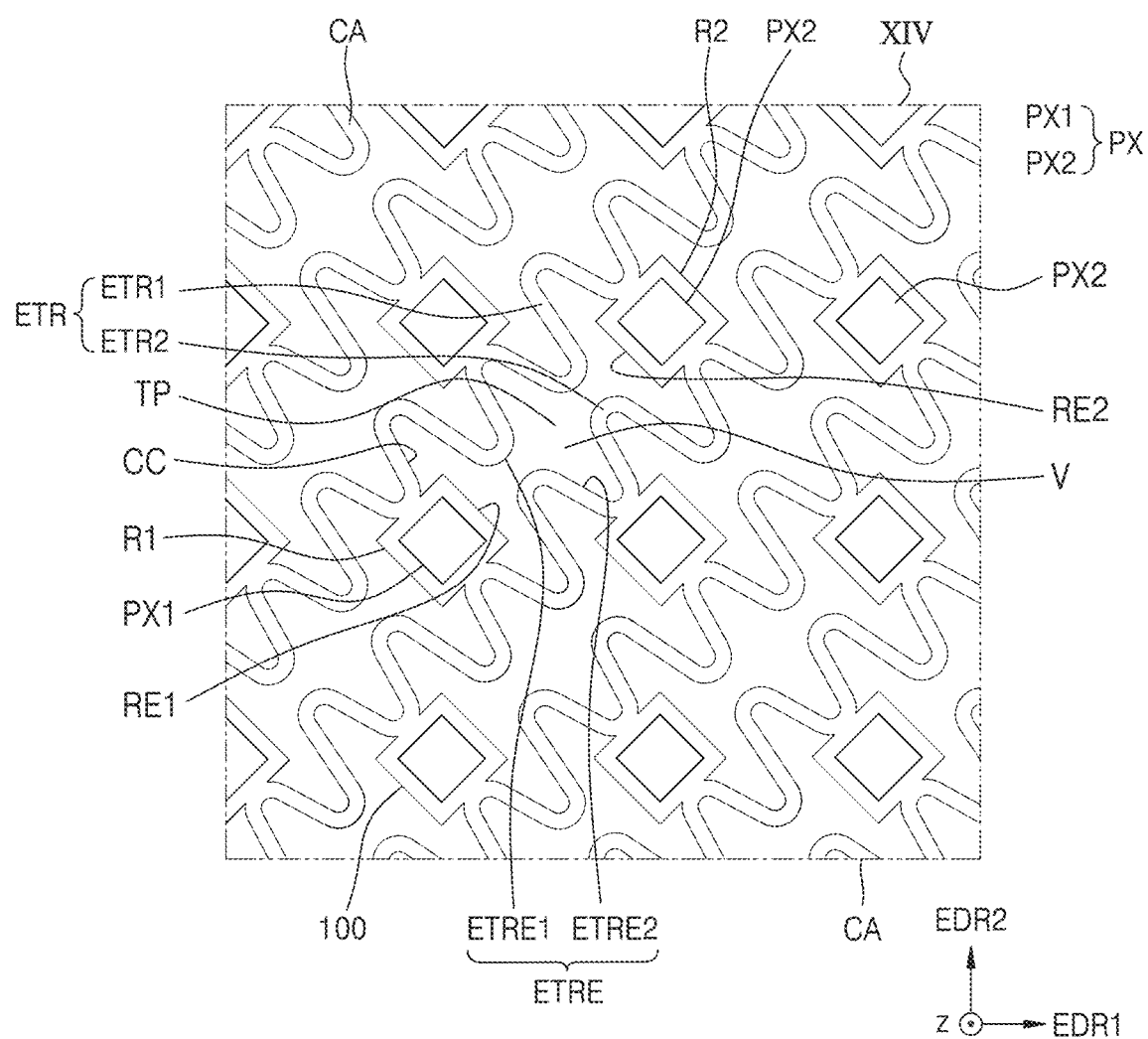

FIGS. 14A and 14B are plan views schematically illustrating a corner area CA according to an embodiment. FIGS. 14A and 14B are enlarged views of region XIV of the display panel 10 of FIG. 10.

Referring to FIGS. 14A and 14B, the corner area CA may include a first area R1 and a second area R2 spaced apart from each other. In an embodiment, the display panel 10 may provide a through-portion TP at least partially defined by an edge RE1 of the first area R1 and an edge RE2 of the second area R2. The edge RE1 of the first area R1 may be an end portion of the first area R1. The edge RE2 of the second area R2 may be an end portion of the second area R2.

The through-portion TP may pass through the display panel 10. Thus, the components of the display panel 10 may not be arranged in the through-portion TP. Because the through-portion TP is defined between the first area R1 and the second area R2 adjacent to each other, when the display panel 10 is curved in the corner area CA, the display panel 10 may be curved without damage. Thus, the through-portion TP may improve the flexibility of the display panel 10.

In an embodiment, the pixel PX may be arranged over the substrate 100 to overlap the corner area CA. In an embodiment, the pixel PX may include a first pixel PX1 and a second pixel PX2. The first pixel PX1 may be arranged over the substrate 100 to overlap the first area R1. The second pixel PX2 may be arranged over the substrate 100 to overlap the second area R2. The first pixel PX1 and the second pixel PX2 may face each other with the through-portion TP therebetween.

Referring to FIG. 14A, the corner area CA may include a first area R1, a second area R2, a first extension area ETR1, and a second extension area ETR2.

The first area R1 and the second area R2 may be spaced apart in a first extension direction EDR1. In other embodiments, the first area R1 and the second area R2 may be spaced apart in a second extension direction EDR2. In an embodiment, the first extension direction EDR1 may be the same as the first direction (e.g., x direction or −x direction) of FIG. 10. In other embodiments, the first extension direction EDR1 may be a direction intersecting with the first direction (e.g., x direction or −x direction) of FIG. 10.

In an embodiment, the second extension direction EDR2 may be the same as the second direction (e.g., y direction or −y direction) of FIG. 10. In other embodiment, the second extension direction EDR2 may be a direction intersecting with the second direction (e.g., y direction or −y direction) of FIG. 10.

The first extension area ETR1 may extend in the first extension direction EDR1. The second extension area ETR2 may extend in the second extension direction EDR2. The first extension direction EDR1 and the second extension direction EDR2 may intersect with each other. In an embodiment, the first extension direction EDR1 and the second extension direction EDR2 may be perpendicular to each other. In other embodiments, the first extension direction EDR1 and the second extension direction EDR2 may form an acute angle or an obtuse angle therebetween. Hereinafter, a detailed description will be mainly given of a case where the first extension direction EDR1 and the second extension direction EDR2 are perpendicular to each other.

Any one of the first extension area ETR1 and the second extension area ETR2 may extend from the first area R1 to the second area R2. For example, the first extension area ETR1 may extend from the first area R1 to the second area R2. Thus, the first area R1, the first extension area ETR1, and the second area R2 may be integrally provided. The first area R1, the first extension area ETR1, and the second area R2 may be connected to each other.

A connection line may be arranged in the first extension area ETR1 and the second extension area ETR2. For example, the connection line may include a signal line for transmitting an electrical signal to the pixel PX and/or a power line for supplying a voltage.

The edge of any one of the first extension area ETR1 and the second extension area ETR2, the edge RE1 of the first area R1, and the edge RE2 of the second area R2 may define at least a portion of the through-portion TP. In an embodiment, an edge ETRE1 of the first extension area ETR1, the edge RE1 of the first area R1, and the edge RE2 of the second area R2 may define at least a portion of the through-portion TP. In an embodiment, the edge ETRE1 of the first extension area ETR1, an edge ETRE2 of the second extension area ETR2, the edge RE1 of the first area R1, and the edge RE2 of the second area R2 may define at least a portion of the through-portion TP.

Any one of the first area R1 and the second area R2, a portion of the first extension area ETR1 extending therefrom, and a portion of the second extension area ETR2 may be defined as one basic unit U. The basic unit U may be repeatedly arranged in the first extension direction EDR1 and/or the second extension direction EDR2, and the substrate 100 may be understood as being provided by connecting the repeatedly arranged basic units U to each other. Two basic units U adjacent to each other may be symmetrical to each other. For example, in FIG. 14A, two basic units U adjacent to each other in the horizontal direction may be horizontally symmetrical with respect to a symmetry axis that is located therebetween and is parallel to the second extension direction EDR2. Similarly, in FIG. 14A, two basic units U adjacent to each other in the vertical direction may be vertically symmetrical with respect to a symmetry axis that is located therebetween and is parallel to the first extension direction EDR1.

Among a plurality of basic units U, adjacent basic units U, for example, four basic units U illustrated in FIG. 14A may form a closed curve CC therebetween, wherein the closed curve CC may define a separation area V that is an empty space. The separation area V may be defined by a closed curve CC formed by the edge RE1 of the first area R1, the edge RE2 of the second area R2, the edge ETRE1 of the first extension area ETR1, and the edge ETRE2 of the second extension area ETR2. The separation area V may overlap the through-portion TP of the display panel.

Referring to FIG. 14B, the corner area CA may include a first area R1, a second area R2, and an extension area ETR. In an embodiment, the first area R1 and the second area R2 may be spaced apart from each other in a direction intersecting with the first extension direction EDR1 and the second extension direction EDR2.

The extension area ETR may extend from the first area R1 to the second area R2. The extension direction of the extension area ETR may change at least two times. In an embodiment, the extension area ETR may extend in a first direction and then may extend in a second direction intersecting with the first direction and may extend in a third direction intersecting with the second direction. In this case, the first direction and the third direction may be the same as each other. The extension area ETR may extend serpentinely. In an embodiment, the extension area ETR may extend in a sine curve shape.

The extension areas ETR may be provided as a plurality of extension areas. The plurality of extension areas ETR may be spaced apart from each other. A connection line may be arranged in the extension area ETR. For example, the connection line may include a signal line for transmitting an electrical signal to the pixel PX and/or a power line for supplying a voltage.

In an embodiment, the adjacent extension areas ETR may be symmetrically arranged with respect to a direction in which the first and second areas R1 and R2 are spaced apart from each other. For example, the first extension area ETR1 and the second extension area ETR2 may extend serpentinely. The first area R1 and the second area R2 may be connected to the first extension area ETR1 and the second extension area ETR2, respectively. In this case, the first extension area ETR1 and the second extension area ETR2 adjacent to each other may be symmetrically arranged with respect to a direction in which the first area R1 and the second area R2 adjacent to each other are spaced apart from each other.

An edge ETRE of the extension area ETR, the edge RE1 of the first area R1, and the edge RE2 of the second area R2 may define at least a portion of the through-portion TP. The edge RE1 of the first area R1, the edge RE2 of the second area R2, the edge ETRE1 of the first extension area ETR1, and the edge ETRE2 of the second extension area ETR2, which are adjacent to each other, may define a through-portion TP. In other words, the edge RE1 of the first area R1, the edge RE2 of the second area R2, the edge ETRE1 of the first extension area ETR1, and the edge ETRE2 of the second extension area ETR2, which are adjacent to each other, may form a closed curve CC. The closed curve CC may define a separation area V that is an empty space. The separation area V may overlap the through-portion TP of the display panel.

The embodiment of FIGS. 14A and 14B have been described above as being applied to the corner area CA; however, in other embodiments, the shape of the substrate 100 of FIGS. 14A and/or 14B may be generally applied to the front area FA and the corner area CA of FIG. 10.

Figure 15:
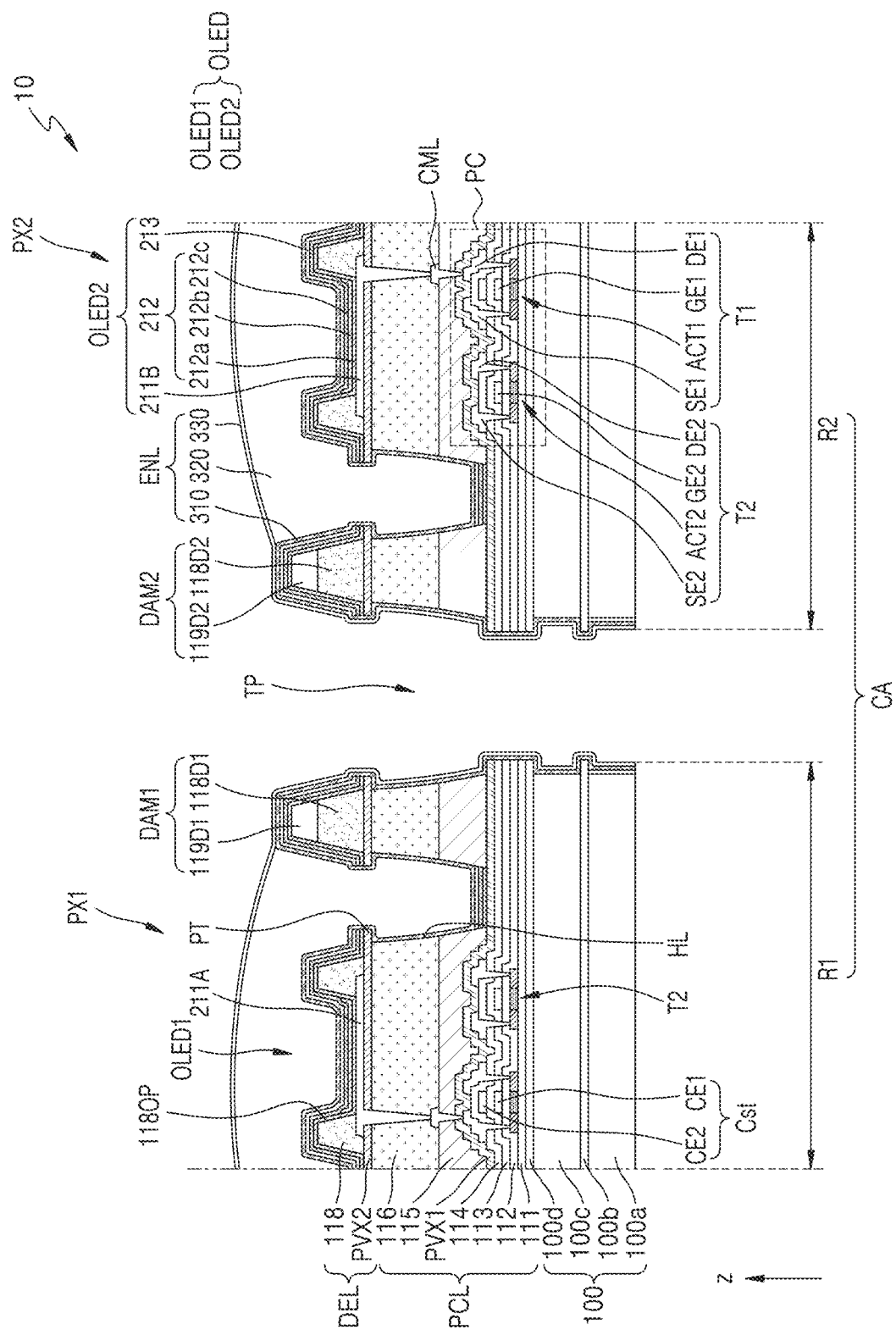
FIG. 15 is a cross-sectional view schematically illustrating a display panel in a corner area according to an embodiment.

FIG. 15 is a cross-sectional view schematically illustrating a display panel 10 in a corner area CA according to an embodiment. In FIG. 15, like reference numerals as those in FIG. 12 denote like members, and thus, redundant descriptions thereof will be omitted for conciseness.

Referring to FIG. 15, a substrate 100 of the display panel 10 may include a corner area CA. The corner area CA may include a first area R1 and a second area R2 spaced apart from each other, and the edge of the first area R1 and the edge of the second area R2 may at least partially define a through-portion TP of the display panel 10.

The display panel 10 may include a substrate 100, a buffer layer 111, a pixel circuit layer PCL, a display element layer DEL, and an encapsulation layer ENL. In an embodiment, the substrate 100, the buffer layer 111, the pixel circuit layer PCL, the display element layer DEL, and the encapsulation layer ENL may be separated with the through-portion TP therebetween. In an embodiment, the pixel circuit layer PCL may further include a first inorganic layer PVX1. In an embodiment, the display element layer DEL may further include a second inorganic layer PVX2.

Hereinafter, a stack structure of the display panel 10 including the through-portion TP will be described in detail. However, the stack structure of the display panel 10 including the through-portion TP is not limited thereto, and various embodiments thereof may be possible.

A first organic insulating layer 115 and a second organic insulating layer 116 may define a hole HL. In an embodiment, the hole HL may be provided by overlapping a hole of the first organic insulating layer 115 and a hole of the second organic insulating layer 116 each other. In other embodiments, the hole HL may be provided in the second organic insulating layer 116. In this case, the upper surface of the first organic insulating layer 115 may be exposed by the hole of the second organic insulating layer 116. Hereinafter, a detailed description will be mainly given a case where the hole HL is provided in the first organic insulating layer 115 and the second organic insulating layer 116.

In an embodiment, the first inorganic layer PVX1 may be arranged between an interlayer insulating layer 114 and the first organic insulating layer 115. The first inorganic layer PVX1 may cover a first source electrode SE1, a first drain electrode DE1, a second source electrode SE2, and a second drain electrode DE2. In an embodiment, the first inorganic layer PVX1 may define a contact hole such that the first source electrode SE1 or the first drain electrode DE1 may be electrically connected to a connection electrode CML.

In other embodiment, the first inorganic layer PVX1 may be arranged between the first organic insulating layer 115 and the second organic insulating layer 116. In this case, the first inorganic layer PVX1 may cover the connection electrode CML. At least a portion of the first inorganic layer PVX1 may be exposed by the hole HL. The first inorganic layer PVX1 may include a single layer or multiple layers including an inorganic material such as silicon nitride ($SiN_x$) and/or silicon oxide ($SiO_2$). In some embodiments, the first inorganic layer PVX1 may be omitted.

An organic light emitting diode OLED may be arranged over the second organic insulating layer 116. The organic light emitting diode OLED may include a first organic light emitting diode OLED1 and a second organic light emitting diode OLED2. The first organic light emitting diode OLED1 may be arranged as a first display element over the substrate 100 to overlap the first area R1. The first organic light emitting diode OLED1 may implement a first pixel PX1. The second organic light emitting diode OLED2 may be arranged as a second display element over the substrate 100 to overlap the second area R2. The second organic light emitting diode OLED2 may implement a second pixel PX2.

The first organic light emitting diode OLED1 may include a first pixel electrode 211A, an intermediate layer 212, and an opposite electrode 213. The second organic light emitting diode OLED2 may include a second pixel electrode 211B, an intermediate layer 212, and an opposite electrode 213. Each of the first pixel electrode 211A and the second pixel electrode 211B may be connected to the connection electrode CML through a contact hole of the second organic insulating layer 116.

The second inorganic layer PVX2 may be arranged between the organic light emitting diode OLED and the second organic insulating layer 116. The second inorganic layer PVX2 may include a plurality of inorganic patterns spaced apart from each other over the second organic insulating layer 116. The second inorganic layer PVX2 may include a protrusion tip PT protruding toward the center of the hole HL. Thus, the lower surface of the protrusion tip PT may be exposed through the hole HL. That is, the hole HL may have an undercut structure. The second inorganic layer PVX2 may include a single layer or multiple layers including an inorganic material such as silicon nitride ($SiN_x$) and/or silicon oxide ($SiO_2$).

The hole HL and the protrusion tip PT of the second inorganic layer PVX2 may be a structure for disconnecting a first functional layer 212a and a second functional layer 212c. In an embodiment, the first functional layer 212a, the second functional layer 212c, and the opposite electrode 213 may be disposed over the front surface of the substrate 100. In this case, the first functional layer 212a and the second functional layer 212c may include an organic material, and external oxygen or moisture or the like may flow into the organic light emitting diode OLED from the through-portion TP through at least one of the first functional layer 212a and the second functional layer 212c. Alternatively, such oxygen or moisture may damage the organic light emitting diode OLED. The hole HL and the protrusion tip PT of the second inorganic layer PVX2 may disconnect the first functional layer 212a and the second functional layer 212c, and the disconnected first functional layer pattern and second functional layer pattern may be arranged inside the hole HL. Thus, the inflow of moisture or oxygen into the organic light emitting diode OLED from the through-portion TP may be prevented, and damage to the organic light emitting diode OLED may be prevented. However, the structure for disconnecting the first functional layer 212a and the second functional layer 212c is not limited thereto, and various structures for disconnecting the first functional layer 212a and the second functional layer 212c may be applied to the display panel 10.

A first dam unit DAM1 and a second dam unit DAM2 may be arranged over the second inorganic layer PVX2. The first dam unit DAM1 and the second dam unit DAM2 may protrude from the second inorganic layer PVX2 in the thickness direction of the substrate 100. The first dam unit DAM1 and the second dam unit DAM2 may be arranged adjacent to the through-portion TP.

The first dam unit DAM1 may be arranged over the first area R1. In an embodiment, the first dam unit DAM1 may surround the first organic light emitting diode OLED1. The first dam unit DAM1 may be arranged closer to the through-portion TP than the hole HL. The first dam unit DAM1 may include a first pattern layer 118D1 and a first upper pattern layer 119D1. In an embodiment, the first pattern layer 118D1 may include the same material as a pixel definition layer 118. The first upper pattern layer 119D1 may include an organic insulating material and/or an inorganic insulating material.

The second dam unit DAM2 may be arranged over the second area R2. In an embodiment, the second dam unit DAM2 may surround the second organic light emitting diode OLED2. The second dam unit DAM2 may be arranged closer to the through-portion TP than the hole HL. The second dam unit DAM2 may include a second pattern layer 118D2 and a second upper pattern layer 119D2. In an embodiment, the second pattern layer 118D2 may include the same material as the pixel definition layer 118 and the first pattern layer 118D1. The pixel definition layer 118, the first pattern layer 118D1, and the second pattern layer 118D2 may be simultaneously formed. The second upper pattern layer 119D2 may include an organic insulating material and/or an inorganic insulating material. The second upper pattern layer 119D2 may include the same material as the first upper pattern layer 119D1. The first upper pattern layer 119D1 and the second upper pattern layer 119D2 may be simultaneously formed. In some embodiments, at least one of the first dam unit DAM1 and the second dam unit DAM2 may be omitted.

The encapsulation layer ENL may cover the first organic light emitting diode OLED1 and the second organic light emitting diode OLED2. The encapsulation layer ENL may be arranged over the opposite electrode 213. The encapsulation layer ENL may be separated with the through-portion TP therebetween. In an embodiment, the encapsulation layer ENL may include at least one inorganic encapsulation layer and at least one organic encapsulation layer. In an embodiment, FIG. 15 illustrates that the encapsulation layer ENL includes a first inorganic encapsulation layer 310, an organic encapsulation layer 320, and a second inorganic encapsulation layer 330 that are sequentially stacked.

The first inorganic encapsulation layer 310 may cover the organic light emitting diode OLED. The first inorganic encapsulation layer 310 may entirely and continuously cover the substrate 100. The first inorganic encapsulation layer 310 may cover the first organic light emitting diode OLED1, the hole HL, the first dam unit DAM1, the second dam unit DAM2, and the second organic light emitting diode OLED2. The first inorganic encapsulation layer 310 may contact the protrusion tip PT of the second inorganic layer PVX2. The first inorganic encapsulation layer 310 may contact the first inorganic layer PVX1. Thus, it may be possible to prevent moisture or oxygen from flowing from the through-portion TP into the organic light emitting diode OLED through a layer including an organic material. Also, the first inorganic encapsulation layer 310 may be separated with respect to the through-portion TP.

The organic encapsulation layer 320 may be arranged over the first inorganic encapsulation layer 310. The organic encapsulation layer 320 may overlap the first organic light emitting diode OLED1 and the second organic light emitting diode OLED2, and the organic encapsulation layer 320 may fill the hole HL. In an embodiment, the organic encapsulation layer 320 may be separated with respect to the through-portion TP. For example, the organic encapsulation layer 320 overlapping the first organic light emitting diode OLED1 may extend to the first dam unit DAM1. The organic encapsulation layer 320 overlapping the second organic light emitting diode OLED2 may extend to the second dam unit DAM2. Because the first dam unit DAM1 and the second dam unit DAM2 protrude from the upper surface of the second inorganic layer PVX2 in the thickness direction of the substrate 100, the flow of the material forming the organic encapsulation layer 320 may be controlled.

The second inorganic encapsulation layer 330 may cover the organic encapsulation layer 320. The second inorganic encapsulation layer 330 may entirely and continuously cover the substrate 100. The second inorganic encapsulation layer 330 may contact the first inorganic encapsulation layer 310 over the first dam unit DAM1 and the second dam unit DAM2. Thus, the organic encapsulation layer 320 may be separated by the first dam unit DAM1 and the second dam unit DAM2. Also, the second inorganic encapsulation layer 330 may be separated with respect to the through-portion TP.

As described above, in the display panel according to the embodiments, because the display panel is curved in the corner area in the direction in which the corner edge approaches the center of the display panel, a screen distortion viewed by the user of the electronic apparatus may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel including a first edge extending in a first direction, a second edge extending in a second direction intersecting with the first direction, and a corner edge extending in a curved shape from the first edge to the second edge, the display panel comprising:
   a substrate comprising a front area overlapping a center of the display panel and a corner area extending from the front area to the corner edge; and
   a pixel arranged over the substrate,
   wherein the display panel is curved in the corner area in a direction in which the corner edge approaches the center of the display panel, and
   wherein the corner area comprises a first area, a second area, and a through-portion between the first area and the second area, the through-portion comprising a first portion extending between the first area and the second area in the first direction and a second portion extending from the first portion in the second direction.

2. The display panel of claim 1, wherein the display panel comprises an upper surface where an image is displayed and a lower surface opposite to the upper surface,
   the corner area comprises a plurality of corner areas, and
   the lower surface at least partially surrounds the upper surface in the plurality of corner areas.

3. The display panel of claim 1, wherein the display panel is flat in the front area.

4. The display panel of claim 1, wherein the display panel is curved in a dome shape in the front area.

5. The display panel of claim 1, wherein the front area comprises a first front area and a second front area arranged between the first front area and the corner area, and
   an upper surface of the display panel is flat in the first front area and is curved in the second front area with a different curvature from a curvature of the corner area.

6. The display panel of claim 1, wherein:
   the pixel comprises a first pixel arranged over the substrate to overlap the first area and a second pixel arranged over the substrate to overlap the second area, and
   the through-portion is at least partially defined by an edge of the first area and an edge of the second area.

7. The display panel of claim 6, wherein the first area and the second area extend from the front area to the corner edge, and
   the edge of the first area and the edge of the second area face each other.

8. The display panel of claim 6, wherein the corner area further comprises a first extension area extending in a first extension direction and a second extension area extending in a second extension direction intersecting with the first extension direction,
   one of the first extension area and the second extension area extends from the first area to the second area, and
   an edge of the one of the first extension area and the second extension area, the edge of the first area, and the edge of the second area define at least a portion of the through-portion.

9. The display panel of claim 6, wherein the corner area further comprises an extension area extending from the first area to the second area,
   an extension direction of the extension area changes at least two times along a way from the first area to the second area, and
   an edge of the extension area, the edge of the first area, and the edge of the second area define at least a portion of the through-portion.

10. The display panel of claim 6, further comprising:
    a first display element arranged over the substrate to overlap the first area and implement the first pixel;
    a second display element arranged over the substrate to overlap the second area and implement the second pixel; and
    an encapsulation layer covering the first display element and the second display element and comprising at least one inorganic encapsulation layer and at least one organic encapsulation layer,
    wherein the encapsulation layer is separated with the through-portion therebetween.

11. An electronic apparatus comprising:
    a display panel comprising a first edge extending in a first direction, a second edge extending in a second direction intersecting with the first direction, and a corner edge extending from the first edge to the second edge; and
    an optical unit comprising a plurality of lenses facing the display panel,
    wherein a lens edge of each of the plurality of lenses extends while being spaced apart from the corner edge by a uniform interval in a plan view, and
    wherein the display panel comprises corner area having a first area, a second area, and a through-portion between the first area and the second area, the through-portion comprising a first portion extending between the first area and the second area in the first direction and a second portion extending from the first portion in the second direction.

12. The electronic apparatus of claim 11, wherein each of the lens edge and the corner edge has a curvature, and
    a curvature center of the lens edge and a curvature center of the corner edge coincide with each other in the plan view.

13. The electronic apparatus of claim 11, wherein the lens edge has a curved shape at least partially surrounding a central axis of the optical unit, and
the corner edge has a curved shape at least partially surrounding a center of the display panel.

14. The electronic apparatus of claim 11, wherein the display panel further comprises:
a substrate including a front area overlapping a center of the display panel and the corner area extending from the front area to the corner edge; and
a pixel arranged over the substrate,
wherein the display panel is curved in the corner area in a direction in which the corner edge approaches the center of the display panel.

15. The electronic apparatus of claim 14, wherein the display panel is curved in a direction toward the plurality of lenses.

16. The electronic apparatus of claim 14, wherein the corner area comprises a plurality of corner areas, and
the plurality of lenses face the plurality of corner areas, respectively.

17. The electronic apparatus of claim 11, wherein each of the plurality of lenses comprises a lower surface facing the display panel and an upper surface opposite to the lower surface,
the upper surface comprises a first upper surface and a second upper surface connected to the first upper surface and extending in a direction intersecting with the first upper surface, and
the second upper surface is connected to the lower surface and extends in a direction intersecting with the lower surface.

18. The electronic apparatus of claim 17, wherein the first upper surface comprises a flat surface, and
the second upper surface comprises a curved surface.

19. The electronic apparatus of claim 11, wherein the display panel comprises a first display panel and a second display panel,
the optical unit comprises a first optical unit and a second optical unit,
the first optical unit faces the first display panel, and
the second optical unit faces the second display panel.

20. The electronic apparatus of claim 11, further comprising:
a case unit accommodating the display panel and the optical unit; and
a fixing unit which fixes the case unit to a user's head.

* * * * *